United States Patent
Jeong et al.

(10) Patent No.: US 12,176,225 B2
(45) Date of Patent: Dec. 24, 2024

(54) ASSEMBLY BOARD FOR USE IN A DISPLAY MANUFACTURING METHOD

(71) Applicant: LG ELECTRONICS INC., Seoul (KR)

(72) Inventors: Changhyun Jeong, Seoul (KR); Seongmin Moon, Seoul (KR); Changseo Park, Seoul (KR); Donghae Oh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 452 days.

(21) Appl. No.: 17/621,107

(22) PCT Filed: Jul. 9, 2019

(86) PCT No.: PCT/KR2019/008444
§ 371 (c)(1),
(2) Date: Dec. 20, 2021

(87) PCT Pub. No.: WO2020/262752
PCT Pub. Date: Dec. 30, 2020

(65) Prior Publication Data
US 2022/0351993 A1 Nov. 3, 2022

(30) Foreign Application Priority Data
Jun. 28, 2019 (KR) .......................... 10-2019-0078213

(51) Int. Cl.
*H01L 21/67* (2006.01)
*H01L 21/683* (2006.01)
(Continued)

(52) U.S. Cl.
CPC .... *H01L 21/67144* (2013.01); *H01L 21/6835* (2013.01); *H01L 25/0753* (2013.01);
(Continued)

(58) Field of Classification Search
CPC ..... H01L 21/67144; H01L 2224/95101; H01L 25/167; H01L 2221/68368; H01L 21/68; Y10T 29/53196
(Continued)

(56) References Cited

U.S. PATENT DOCUMENTS 6,536,106 B1 3/2003 Jackson et al.
9,181,630 B2 * 11/2015 Shibata ............... H01L 25/0753
(Continued)

FOREIGN PATENT DOCUMENTS

KR 10-2012-0120377 A 11/2012
KR 10-2013-0033450 A 4/2013
KR 10-1793542 B1 11/2017

OTHER PUBLICATIONS

International Search Report (PCT/ISA/210) issued in PCT/KR2019/008444, dated Mar. 26, 2020.

*Primary Examiner* — Thiem D Phan
(74) *Attorney, Agent, or Firm* — Birch, Stewart, Kolasch & Birch, LLP

(57) ABSTRACT

Discussed is an assembly board including: a base portion; a plurality of assembly electrodes extending in one direction and disposed on the base portion at predetermined intervals; a dielectric layer stacked on the base portion to cover the plurality of assembly electrodes; and barrier ribs stacked on the dielectric layer and defining cells in which semiconductor light emitting diodes are seated at the predetermined intervals along an extending direction of the plurality of assembly electrodes so as to overlap a portion of the plurality of assembly electrodes, wherein the plurality of assembly electrodes include first electrodes and second electrodes disposed on different planes on the base portion, and wherein the first electrodes are disposed on one surface
(Continued)

of the base portion, and the second electrodes are disposed on one surface of the dielectric layer.

11 Claims, 37 Drawing Sheets

(51) Int. Cl.
*H01L 25/075* (2006.01)
*H01L 23/00* (2006.01)
(52) U.S. Cl.
CPC .............. *H01L 24/32* (2013.01); *H01L 24/83* (2013.01); *H01L 24/95* (2013.01); *H01L 2221/68368* (2013.01); *H01L 2224/32238* (2013.01); *H01L 2224/83005* (2013.01); *H01L 2224/83201* (2013.01); *H01L 2224/95001* (2013.01); *Y10T 29/53196* (2015.01)
(58) Field of Classification Search
USPC .......................... 29/744, 729, 739, 740, 760
See application file for complete search history.

(56) References Cited

U.S. PATENT DOCUMENTS

| | | |
|---|---|---|
| 9,287,242 B2 | 3/2016 | Shibata et al. |
| 2018/0102352 A1* | 4/2018 | Sasaki ................... H01L 27/153 |
| 2018/0277524 A1 | 9/2018 | Moon et al. |

* cited by examiner

[FIG. 1]
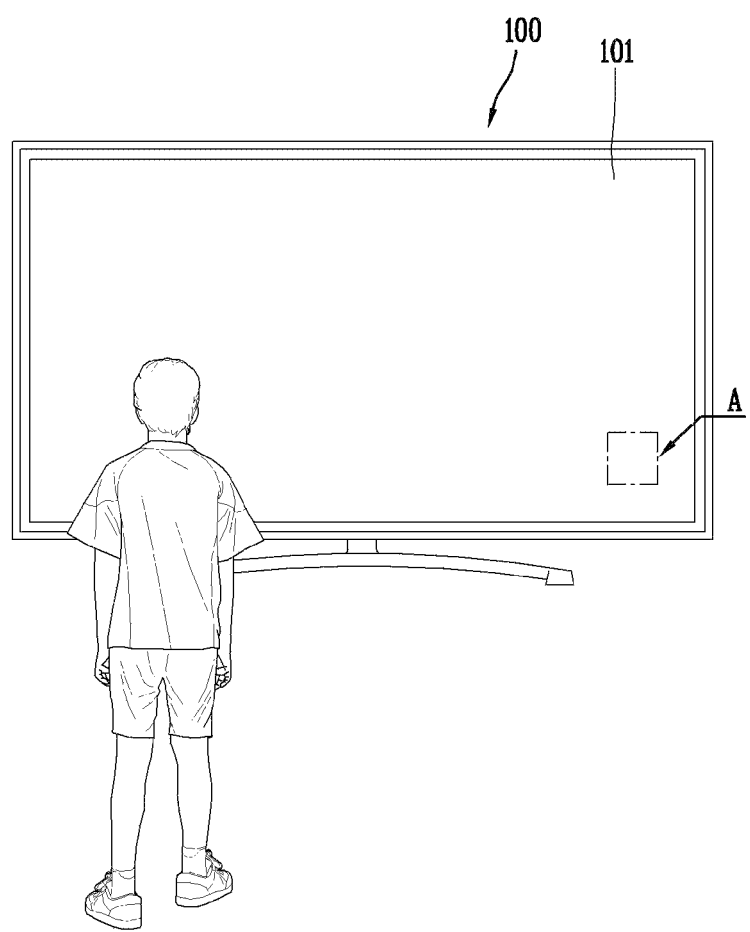

【FIG. 2】
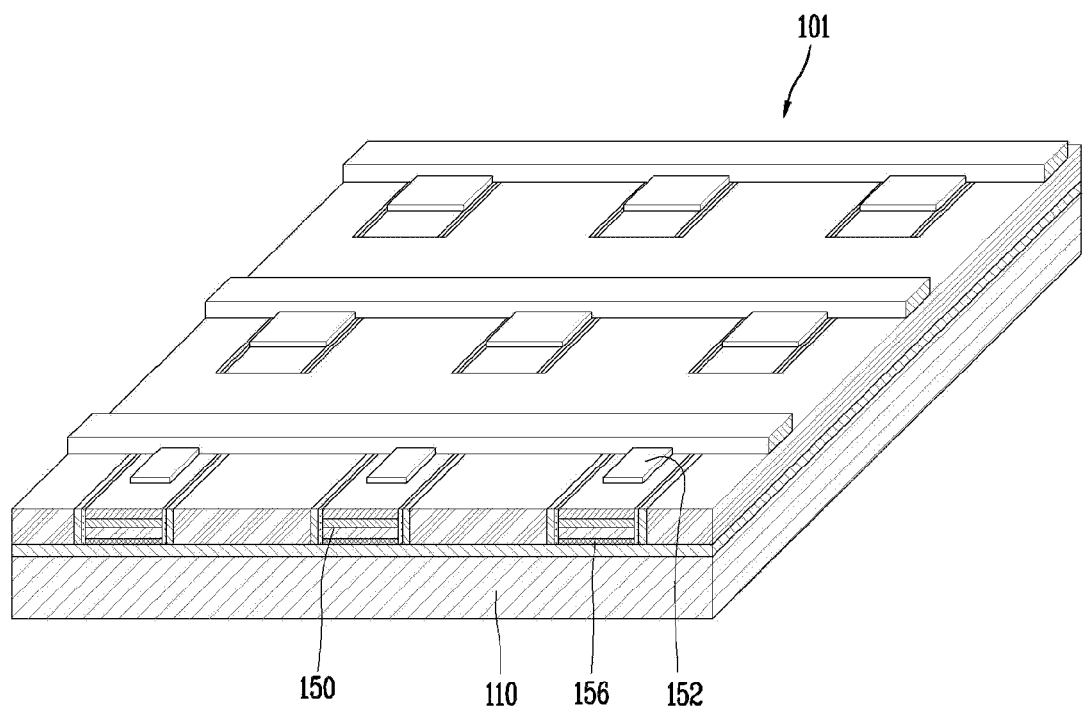

【FIG. 3】
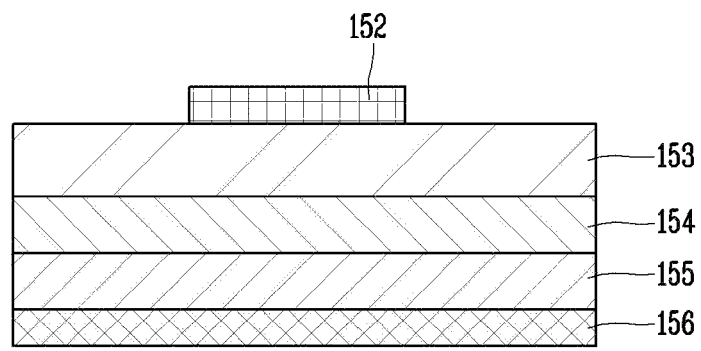

[FIG. 4]
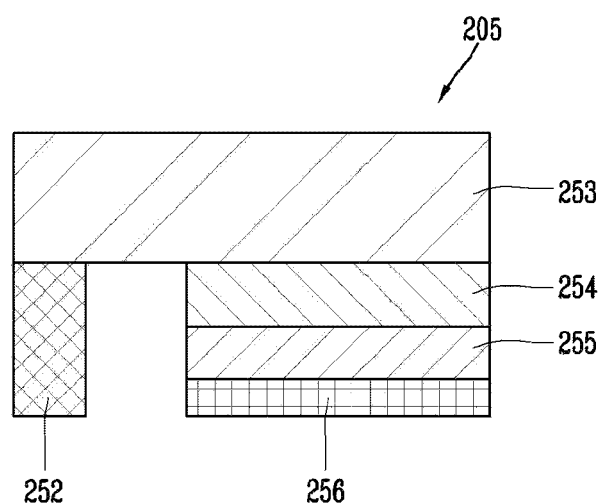

[FIG. 5a]
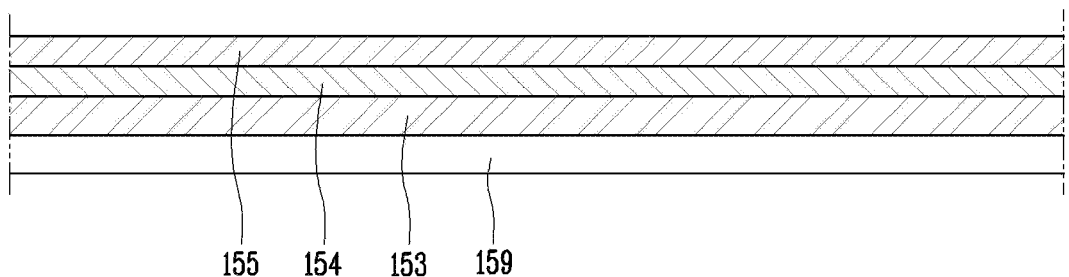
155 154 153 159

【FIG. 5b】
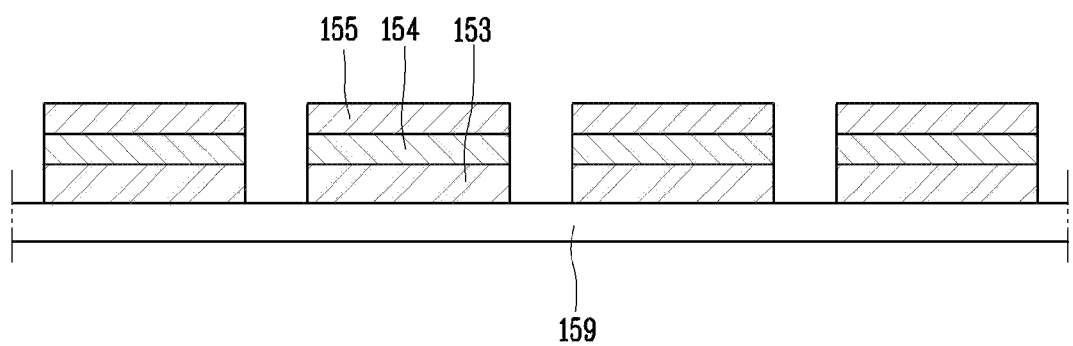

【FIG. 5c】
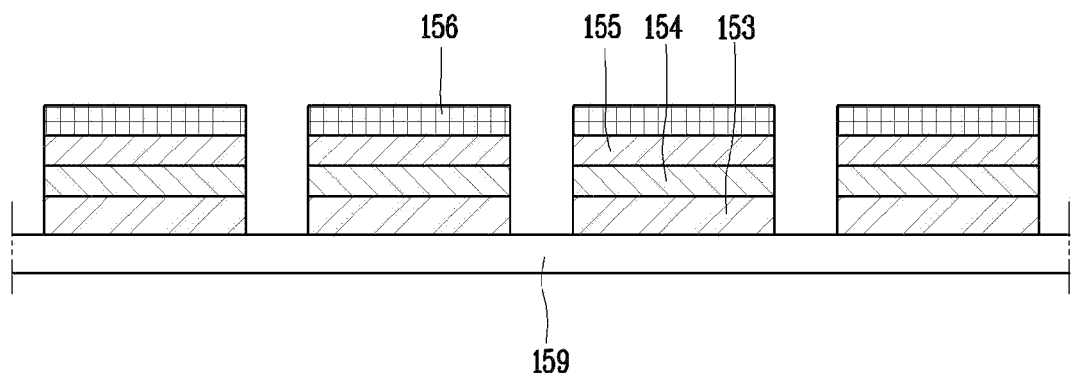

[FIG. 5d]
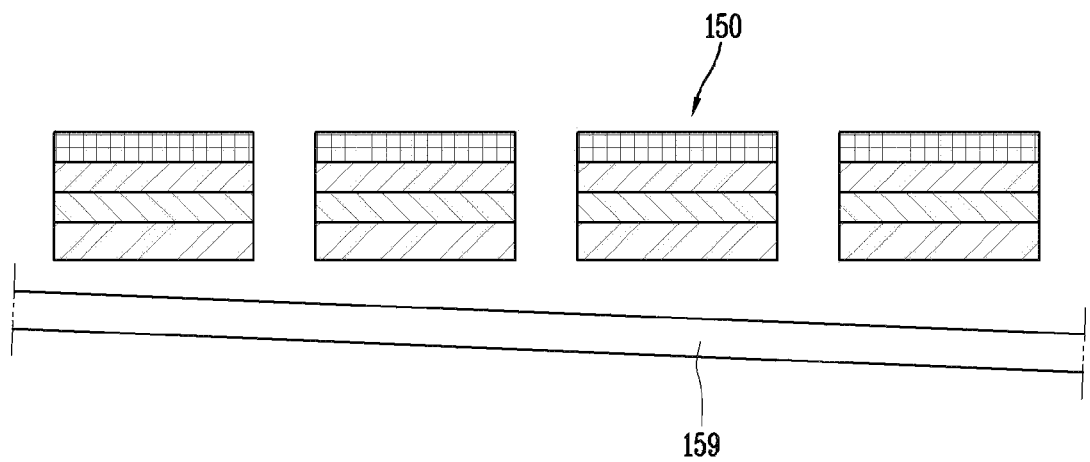

[FIG. 5e]
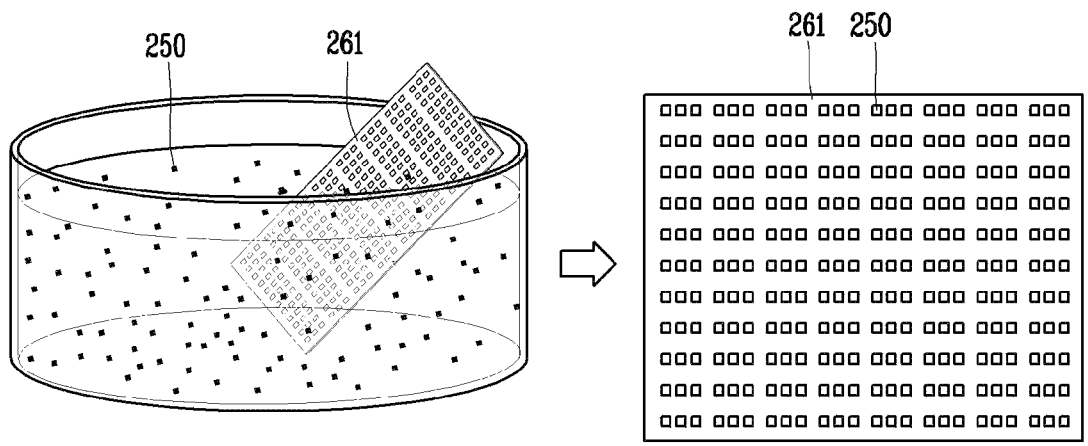

[FIG. 6]
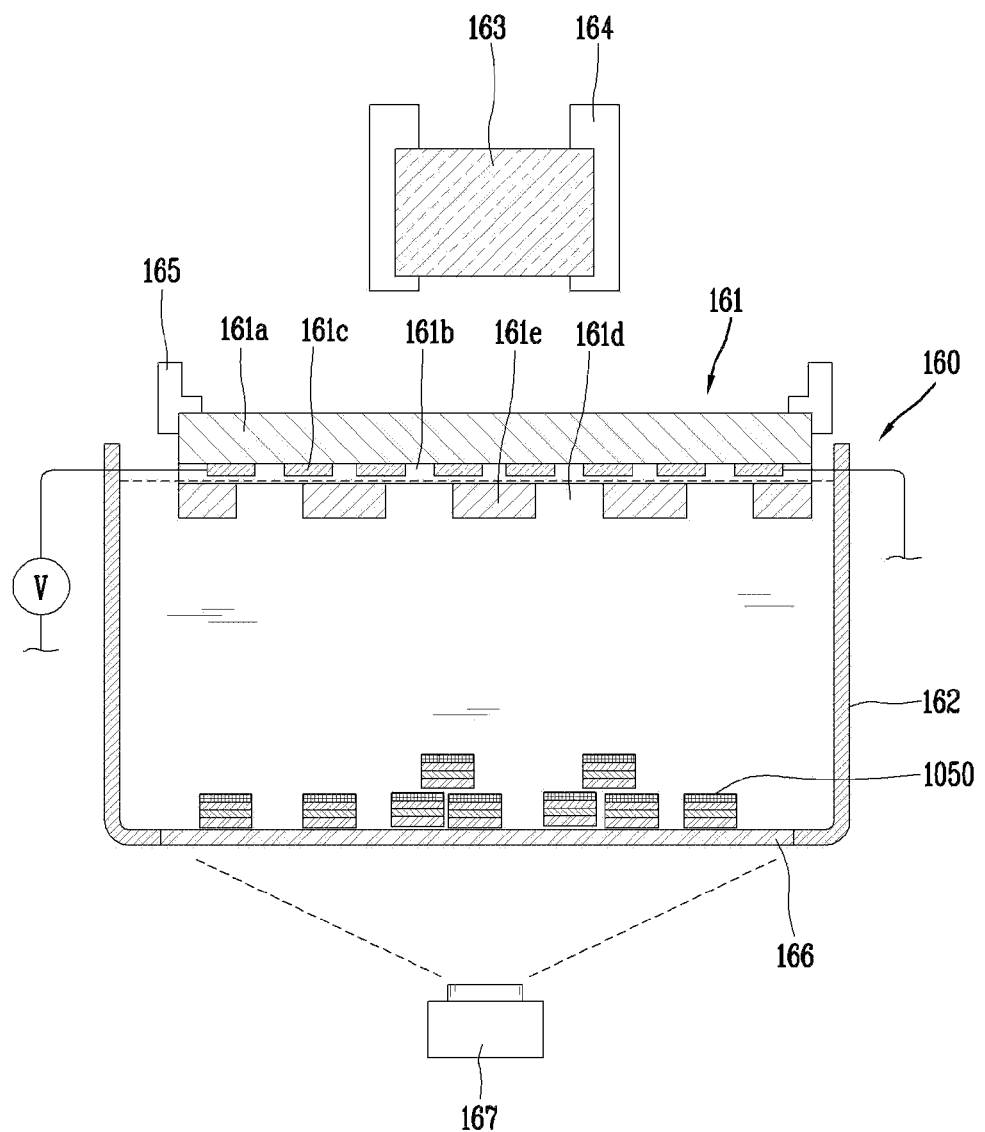

[FIG. 7]
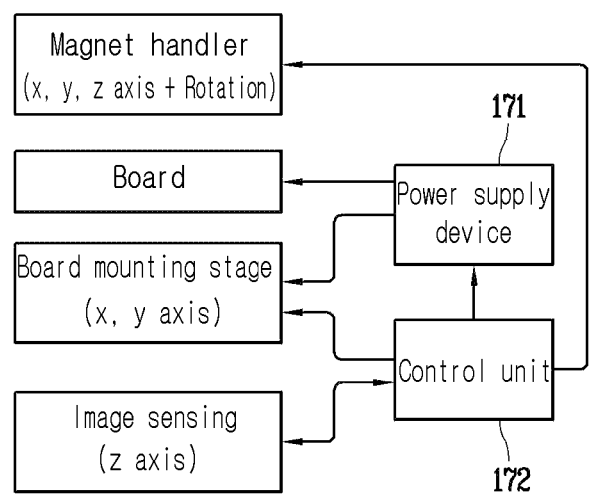

[FIG. 8a]
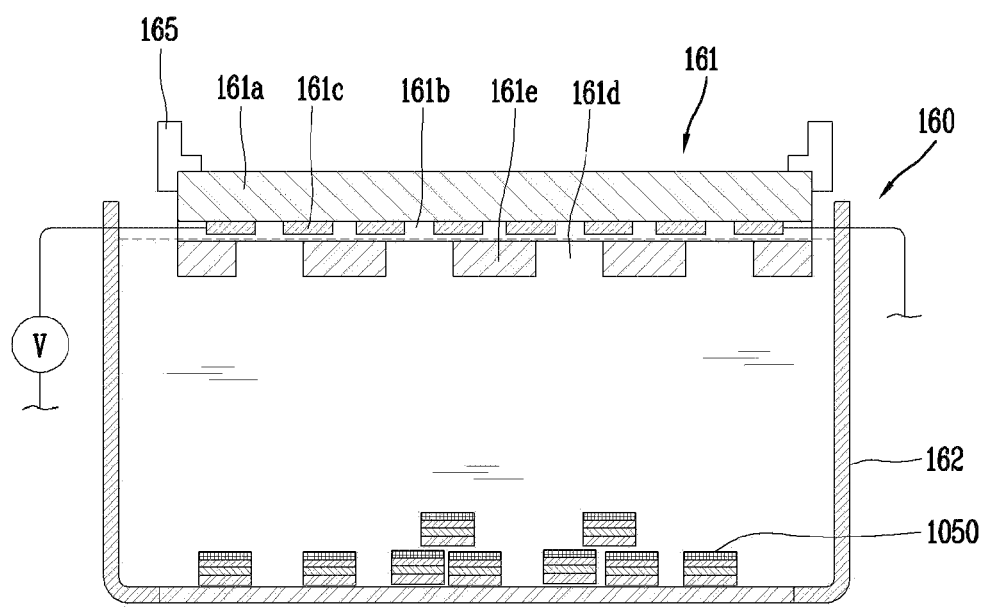

【FIG. 8b】
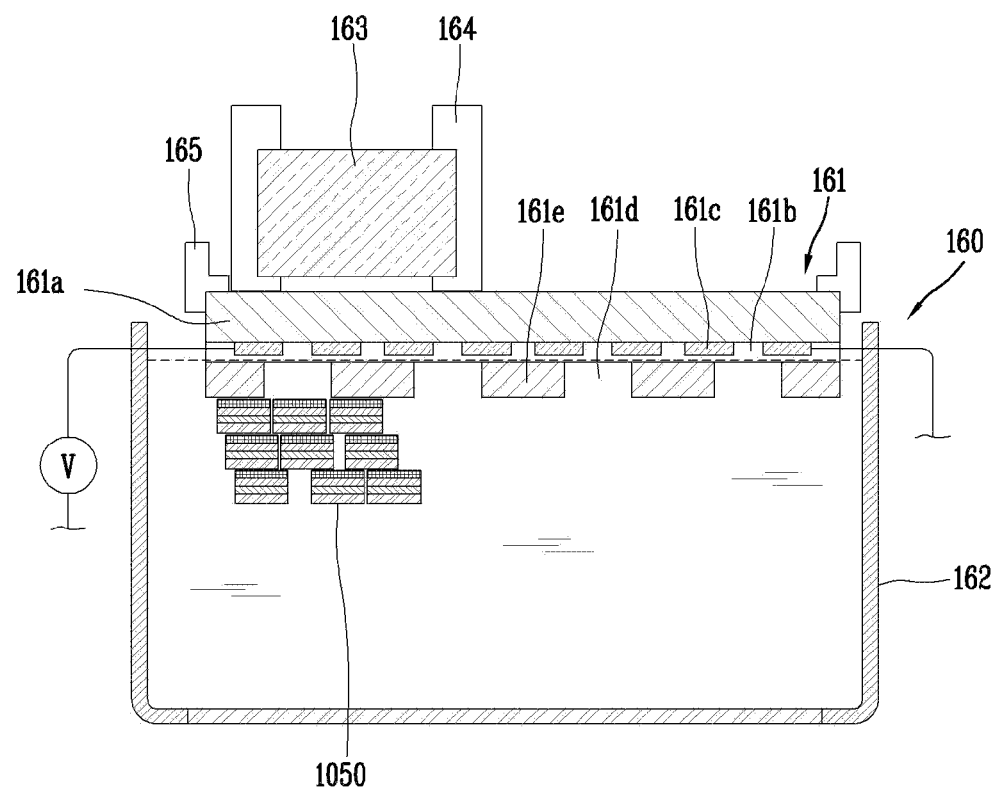

[FIG. 8c]
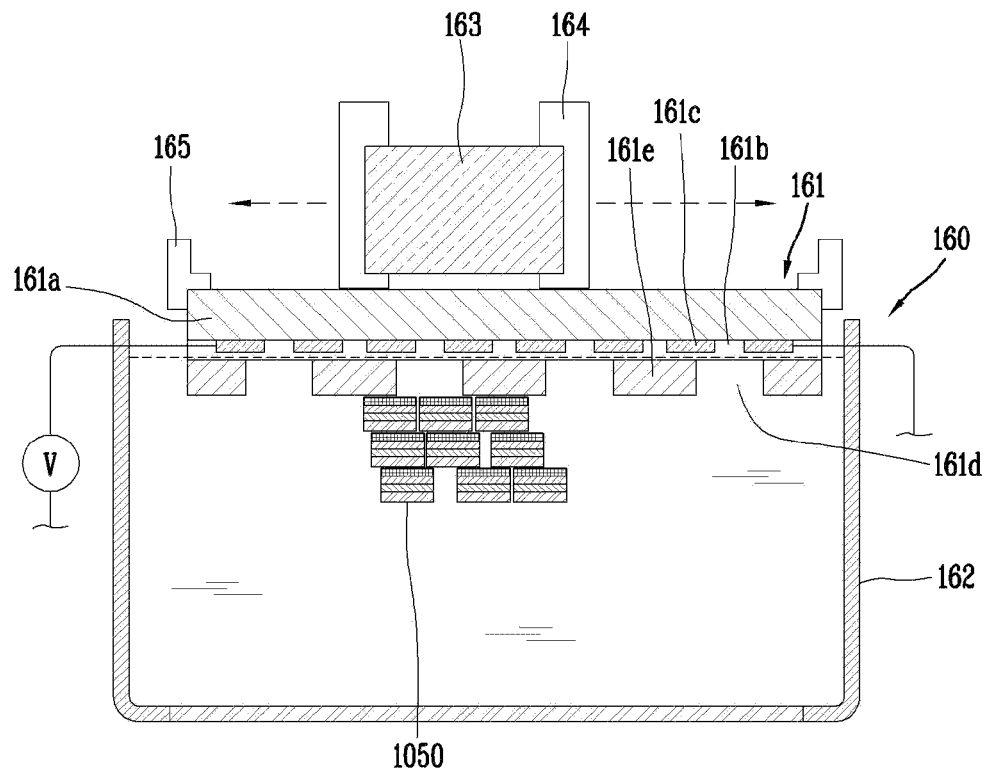

[FIG. 8d]
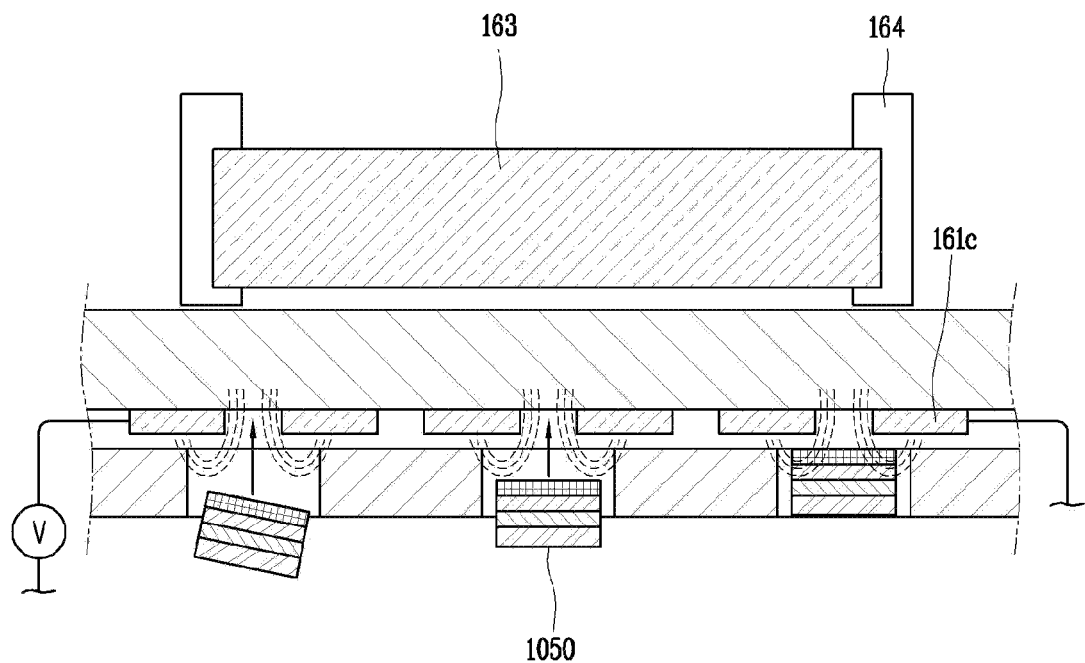

[FIG. 8e]
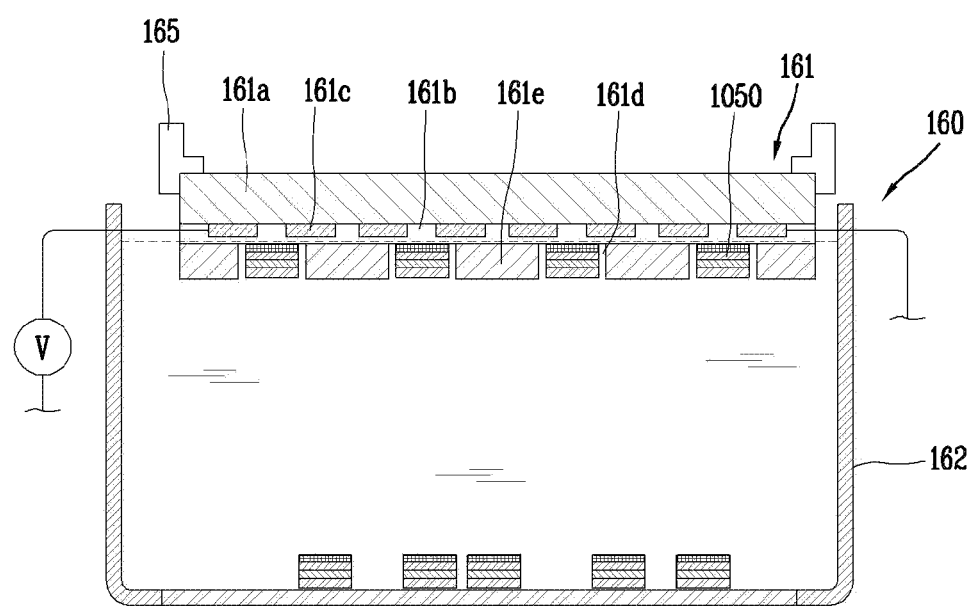

[FIG. 9]
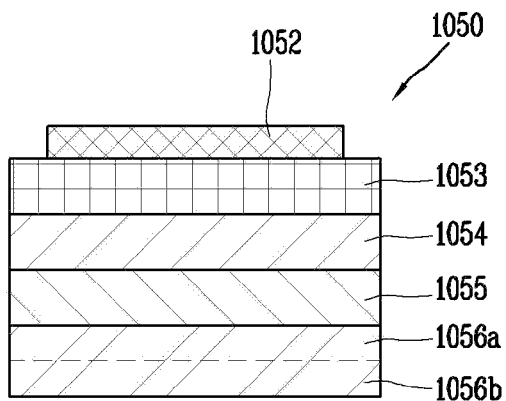

[FIG. 10a]
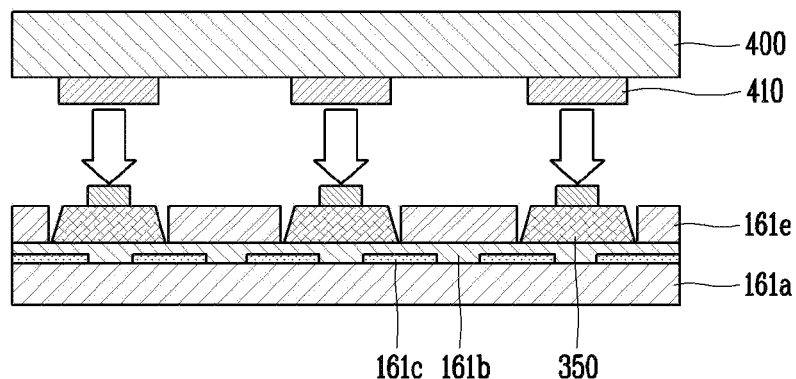

【FIG. 10b】
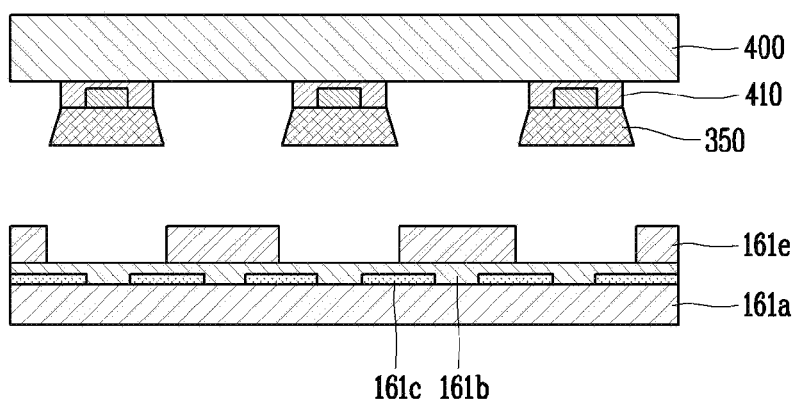

[FIG. 10c]
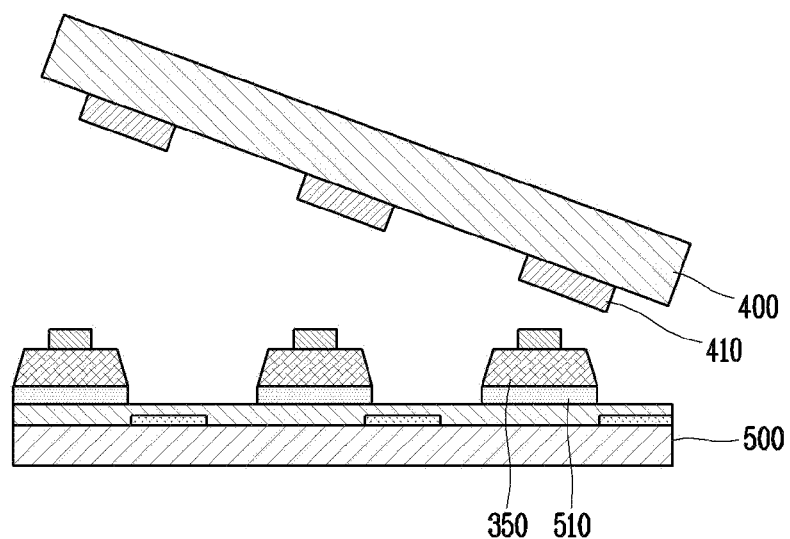

[FIG. 11]
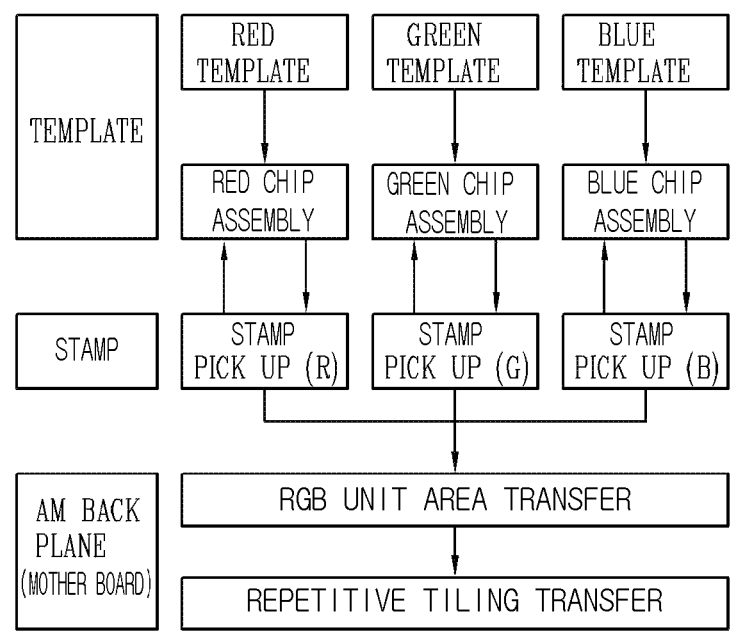

[FIG. 12]
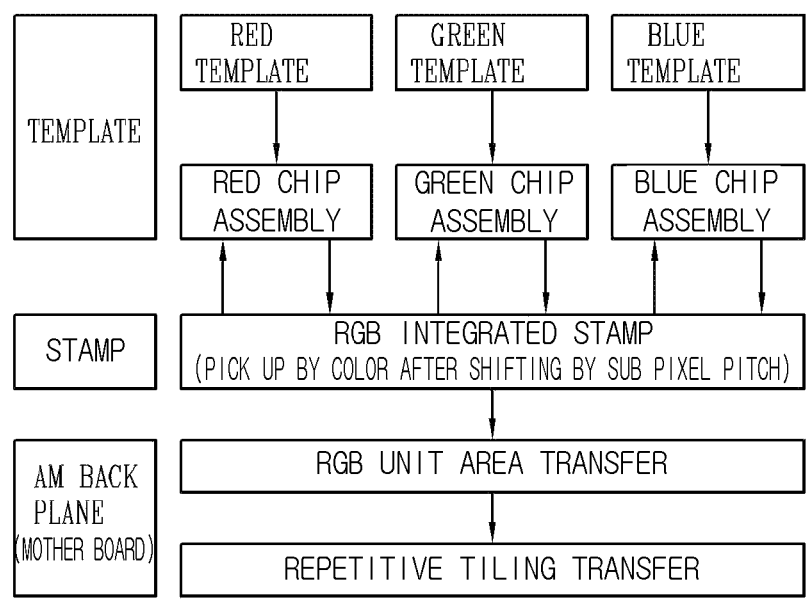

[FIG. 13]
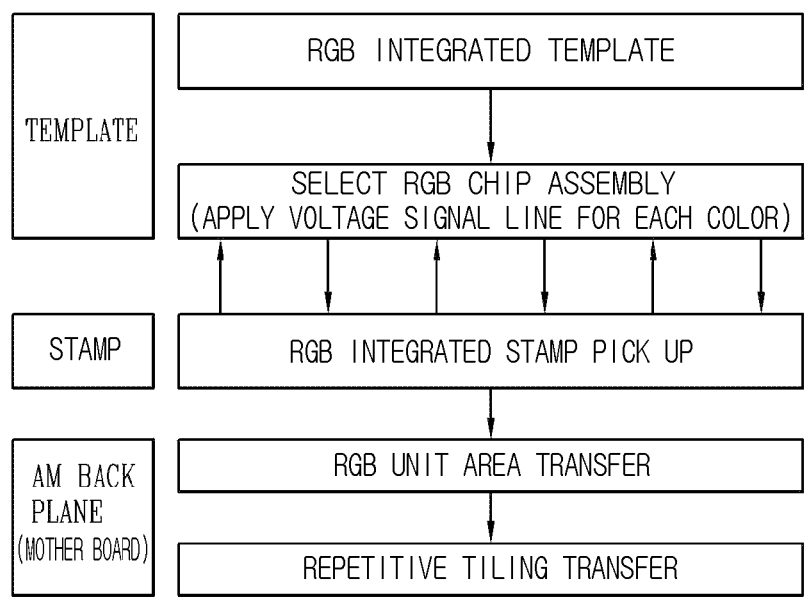

[FIG. 14]
(a)
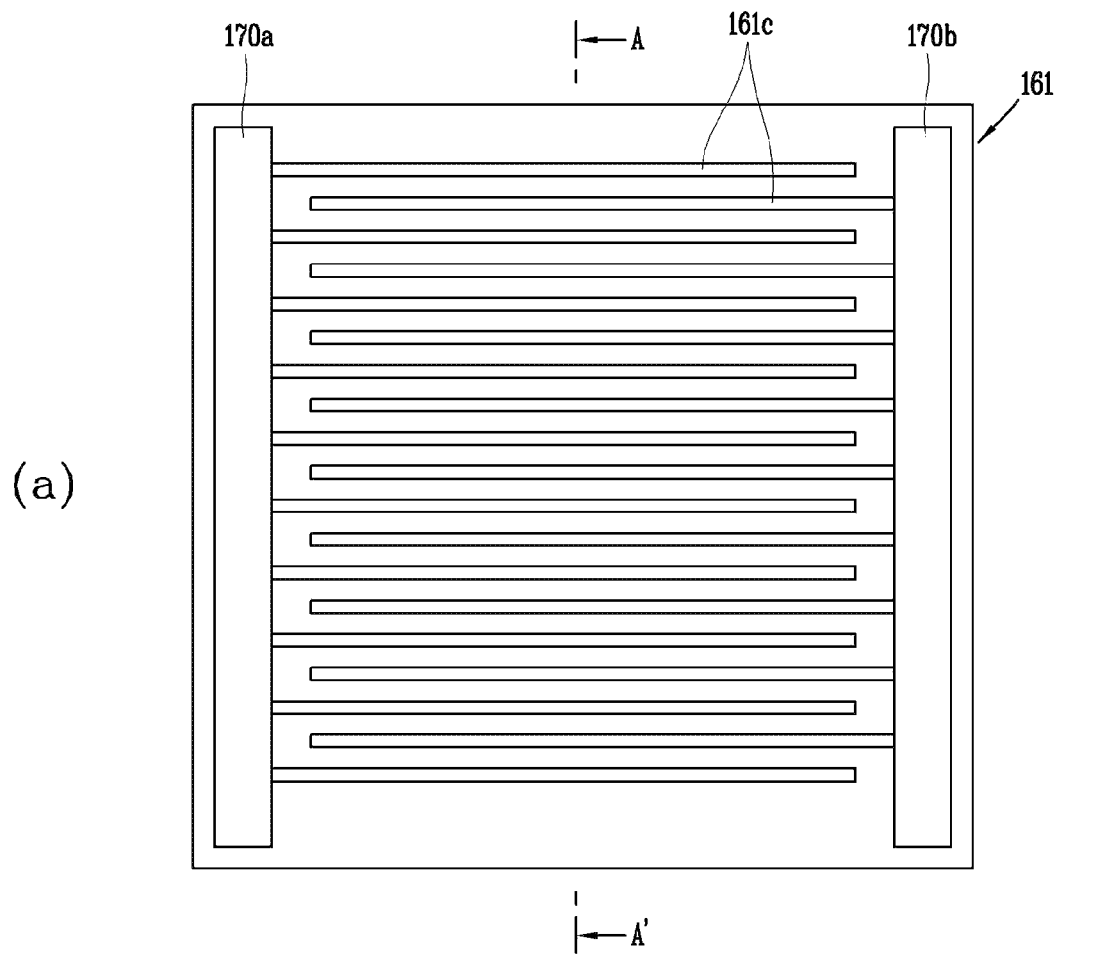
(b)
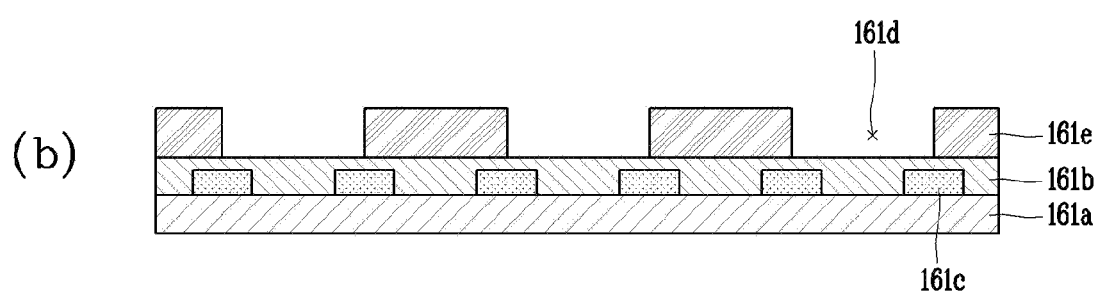

[FIG. 15]
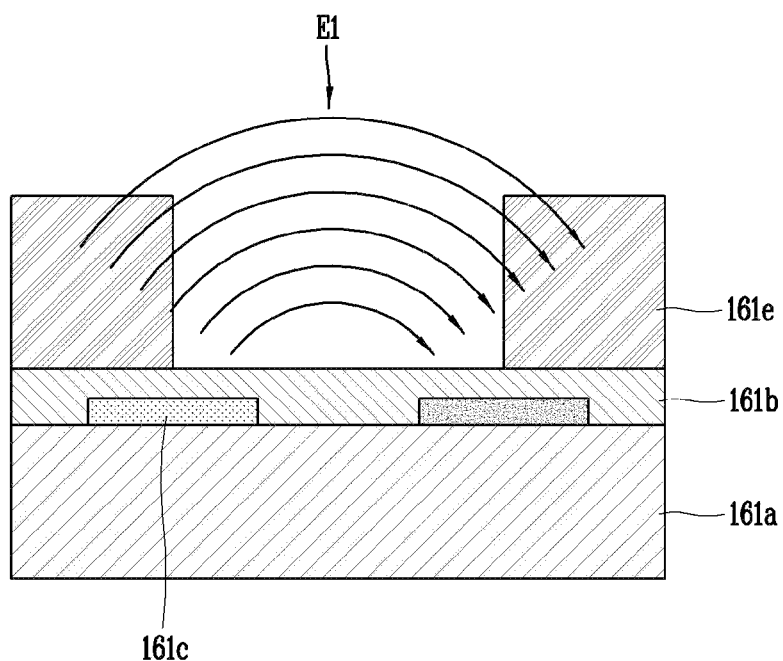

[FIG. 16]
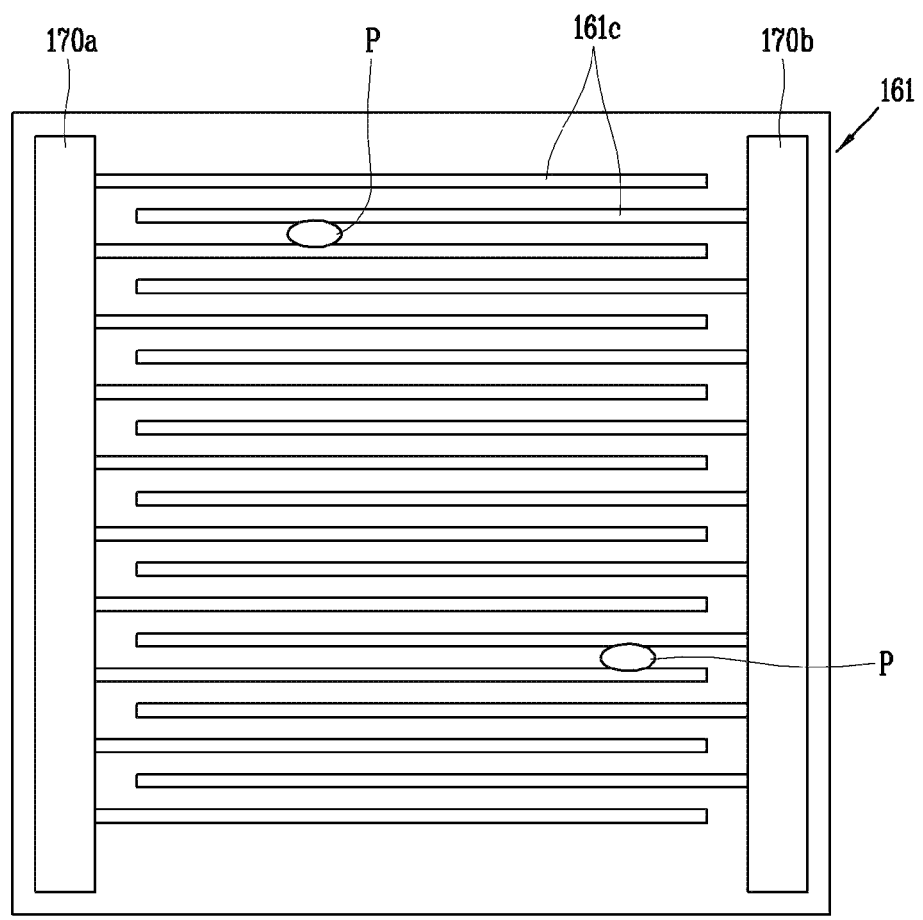

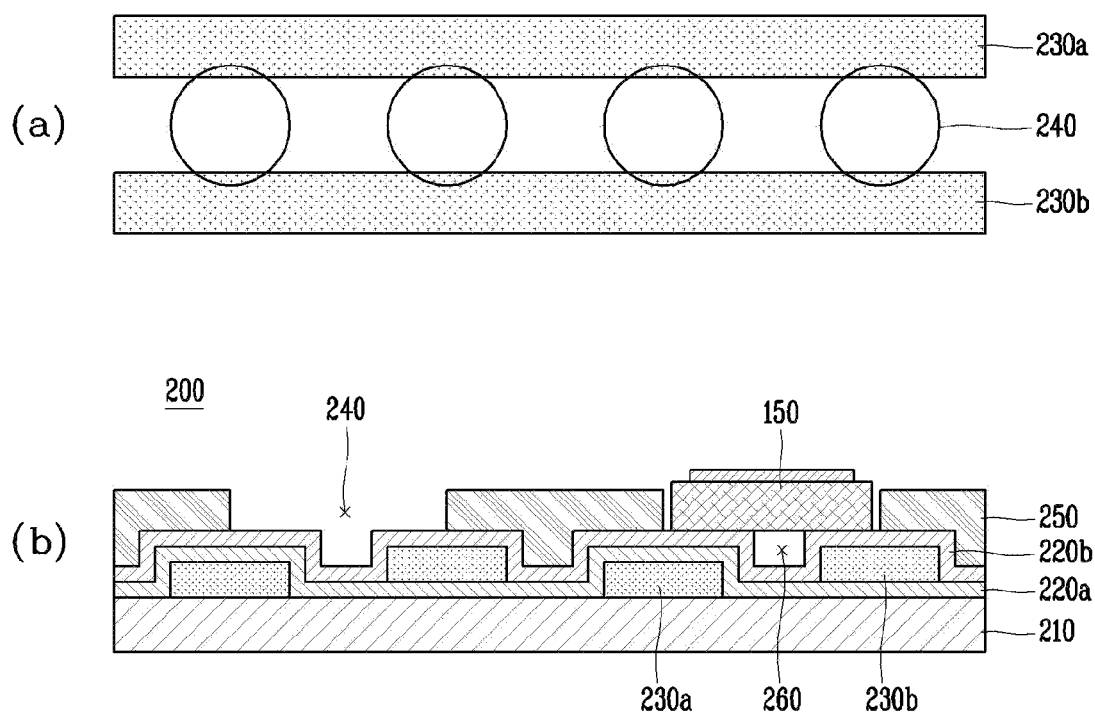
[FIG. 17]

[FIG. 18]
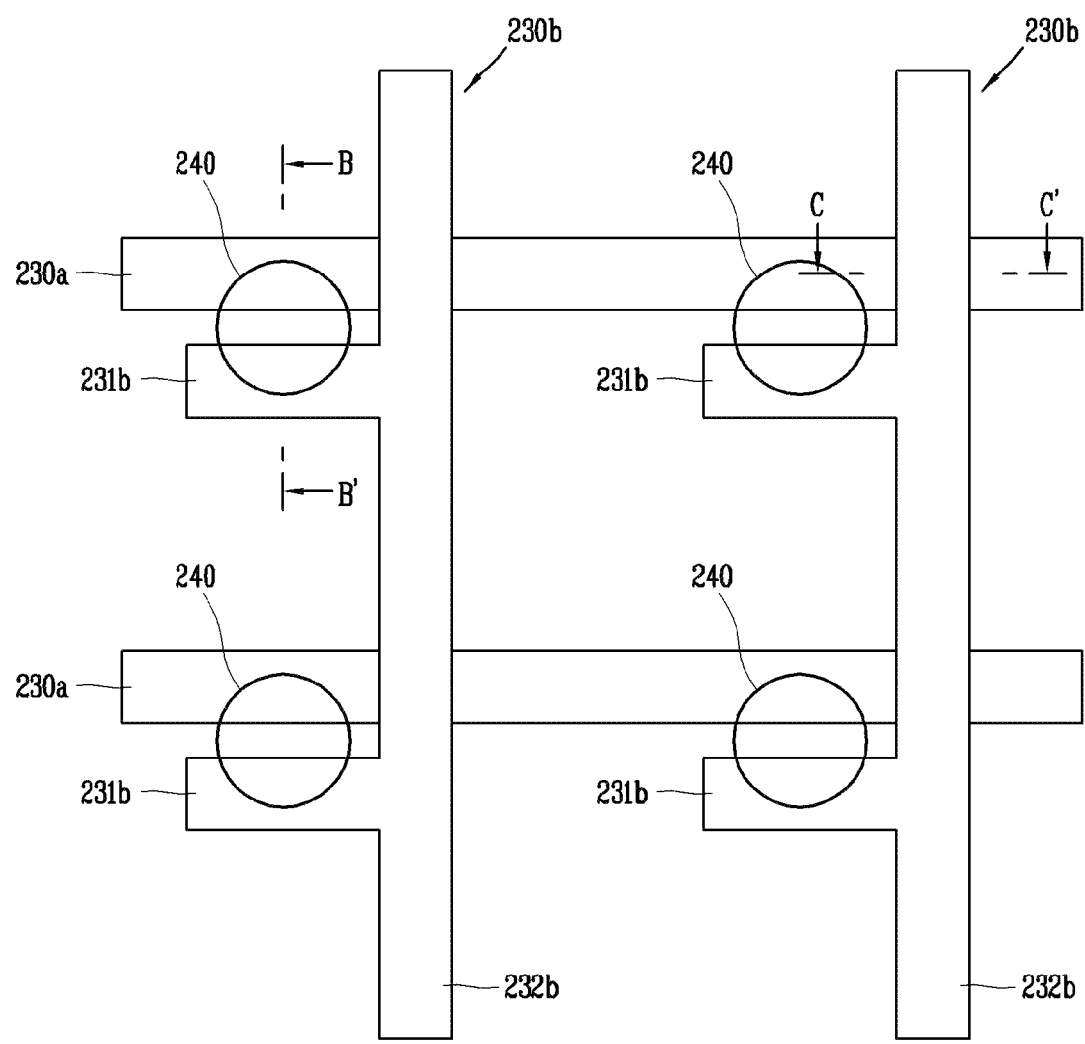

[FIG. 19a]
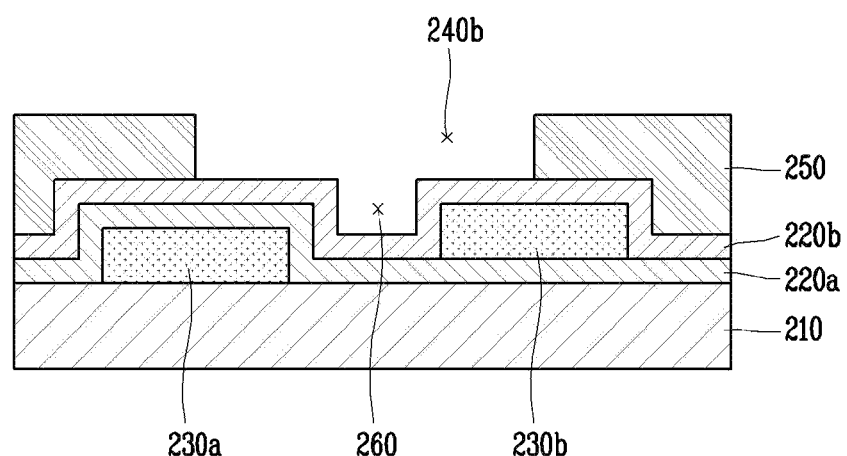

【FIG. 19b】
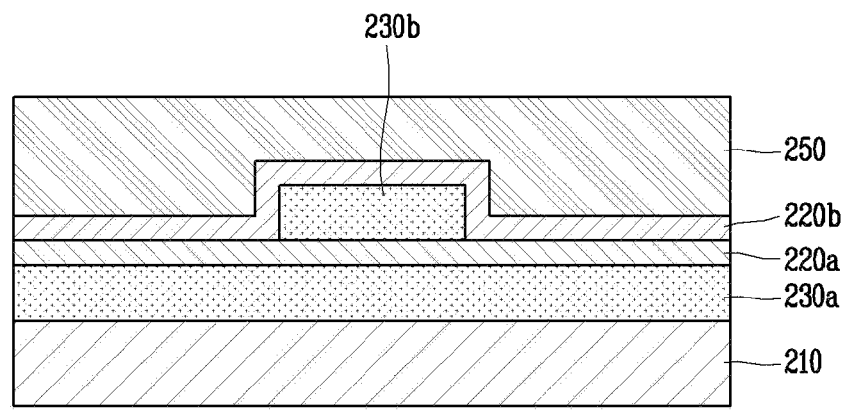

【FIG. 20】
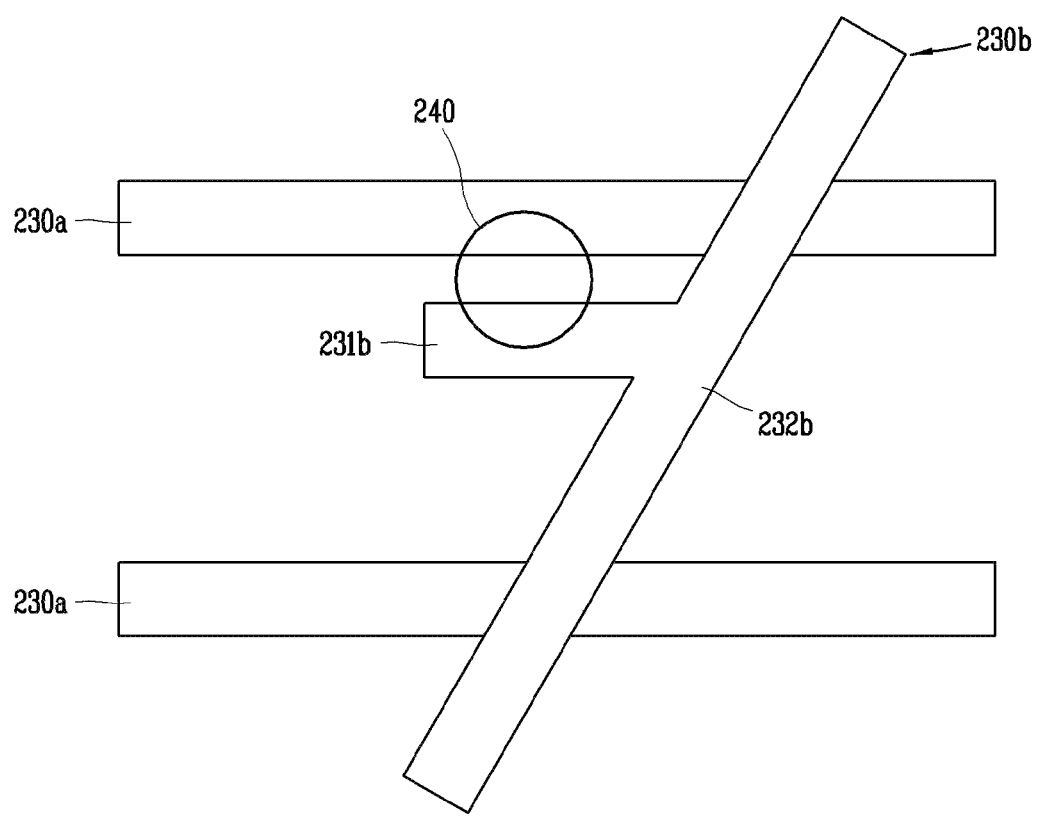

[FIG. 21a]
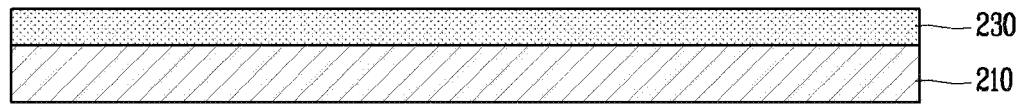

[FIG. 21b]
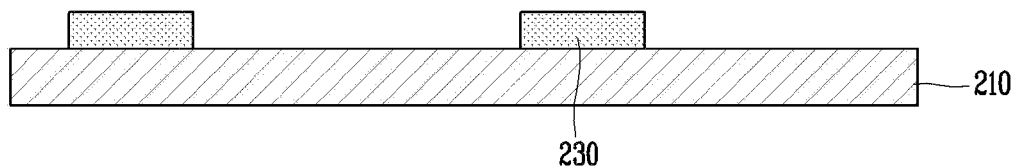

[FIG. 21c]
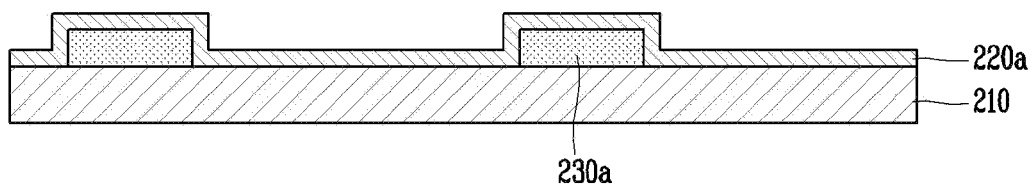

[FIG. 21d]
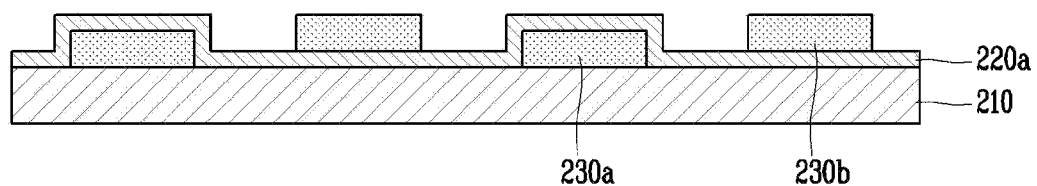

[FIG. 21e]
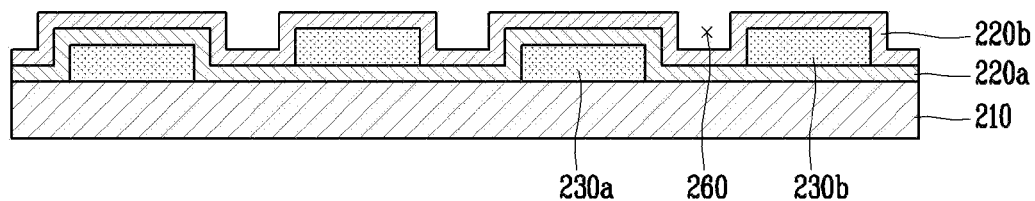

[FIG. 21f]
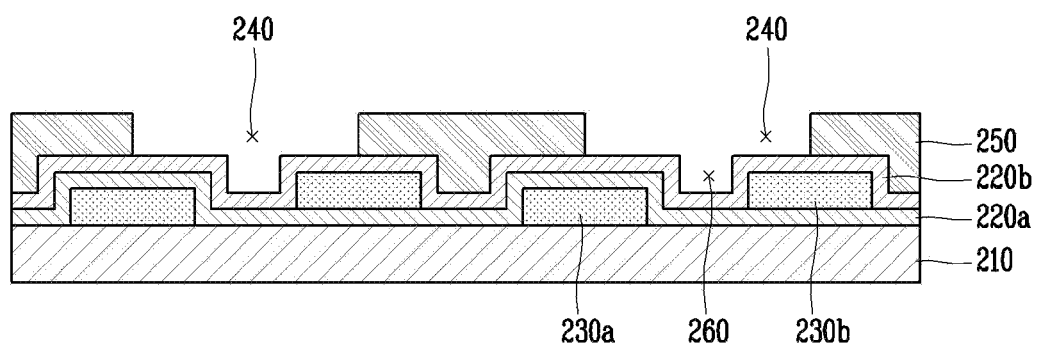

ASSEMBLY BOARD FOR USE IN A DISPLAY MANUFACTURING METHOD

CROSS REFERENCE TO RELATED APPLICATIONS

This application is the National Stage filing under 35 U.S.C. 371 of International Application No. PCT/KR2019/008444, filed on Jul. 9, 2019, which claims the benefit of earlier filing date and right of priority to Korean Application No. 10-2019-0078213, filed on Jun. 28, 2019, the contents of all these applications are hereby incorporated by reference herein in their entirety.

TECHNICAL FIELD

The present disclosure relates to an assembly board used in a method for manufacturing a display device and a method for manufacturing a display device using a semiconductor light emitting diode having a size of several to several tens of μm.

BACKGROUND ART

Recently, liquid crystal displays (LCD), organic light emitting diode (OLED) displays, and micro LED displays are competing to implement large-screen displays in the field of display technology.

However, LCDs have problems that response time is not fast and efficiency of light generated by backlight is low, and OLEDs have problems that the lifespan is short, the mass production yield is not good, and the efficiency is low.

On the other hand, when a semiconductor light emitting diode (micro LED) having a diameter or cross-sectional area of 100 μm or less is used for a display, very high efficiency may be achieved because the display does not absorb light using a polarizing plate or the like. However, since a large-screen display requires millions of semiconductor light emitting diodes, it is difficult to transfer the diodes compared to other technologies.

Techniques currently being developed as a transfer process include pick & place technology, laser lift-off (LLO) technology, or self-assembly technology. Among them, the self-assembly technology is a method in which the semiconductor light emitting diodes find its own position in a fluid, and is the most advantageous method for realizing a large-screen display device.

On the other hand, the self-assembly technology includes a method of directly assembling semiconductor light emitting diodes to the final board (or wiring board) on which wirings are formed, and a method of assembling semiconductor light emitting diodes on the assembly board and transferring the semiconductor light emitting diodes to the final board through an additional transfer process. The method of directly assembling the semiconductor light emitting diodes to the final board is efficient in terms of process, and the method of using the assembly board is an advantage in that structures for self-assembly can be added without limitation, so the two methods are selectively used.

DISCLOSURE

Technical Problem

One object of the present disclosure is to provide an assembly board and a method of manufacturing a display device capable of disposing assembly electrodes to which voltage signals of different polarities are applied on different planes to prevent short circuit between the electrodes in a self-assembly method for mounting a semiconductor light emitting diode on an assembly board using an electric field and a magnetic field in order to improve the assembly rate of the semiconductor light emitting diode.

Another object of the present disclosure is to provide an assembly board and a method of manufacturing a display device capable of selectively assembling a semiconductor light emitting diode by disposing assembly electrodes to which voltage signals of different polarities are applied to cross each other on different planes.

Technical Solution

According to an embodiment of the present disclosure, an assembly board for use in a display manufacturing method for allowing semiconductor light emitting diodes to be seated at preset positions on the assembly board using an electric field and a magnetic field includes a base portion; a plurality of assembly electrodes extending in one direction and disposed on the base portion at predetermined intervals; a dielectric layer stacked on the base portion to cover the assembly electrodes; and barrier ribs stacked on the dielectric layer while forming cells in which the semiconductor light emitting diodes are seated at the predetermined intervals along an extending direction of the assembly electrodes so as to overlap a portion of the assembly electrodes, wherein the assembly electrodes includes first electrodes and second electrodes disposed on different planes on the base portion, and the first electrodes are disposed on one surface of the base portion, and the second electrodes are disposed on one surface of the dielectric layer.

According to an embodiment, the dielectric layer may include a first dielectric layer formed to cover the first electrodes, the second electrodes being disposed on the first dielectric layer, and a second dielectric layer formed to cover the second electrodes and the first dielectric layer, the barrier ribs being stacked on the second dielectric layer.

According to an embodiment, at least one of the first electrodes and the second electrodes may be disposed in parallel to adjacent electrodes disposed on the same plane.

According to an embodiment, the first electrodes and the second electrodes may be in that parallel to each other.

According to an embodiment, the first electrodes and the second electrodes may be orthogonal to each other.

According to an embodiment, one of the first electrodes and the second electrodes may further include a plurality of protrusions protruding in a direction parallel to the second electrodes or the first electrodes.

According to an embodiment, the protrusions may be provided to correspond to the cells, respectively.

According to an embodiment, the first electrodes and the second electrodes may have portions in parallel to each other, which are alternately arranged.

According to an embodiment, a method for manufacturing a display device includes transferring an assembly board to an assembly position and putting a plurality of semiconductor light emitting diodes including a magnetic material into a fluid chamber, applying a magnetic force to the semiconductor light emitting diodes put into the fluid chamber to move in one direction, inducing the semiconductor light emitting diodes to move to preset positions by applying an electric field so as to be seated at the preset positions on the assembly board while the semiconductor light emitting diodes are moving, and transferring the semiconductor light emitting diodes seated on the assembly board to a final board on which wirings are formed, wherein the assembly board includes first and second electrodes formed on different planes as assembly electrodes for forming the electric field, and voltage signals of different polarities are applied to the first and second electrodes.

According to an embodiment, the first electrodes and the second electrodes may be orthogonal to each other.

According to an embodiment, the first electrodes and the second electrodes may cross each other.

According to an embodiment, the preset positions at which the semiconductor light emitting diodes are seated may overlap a portion of the first electrode and a portion of the second electrode.

Advantageous Effects

According to an embodiment of the present disclosure, among the assembly electrodes formed on the assembly board, the first electrode and the second electrode to which voltage signals of different polarities are applied are disposed on different planes to prevent electrode short circuit, and improve the assembly rate of the semiconductor light emitting diodes.

In addition, according to the embodiment of the present disclosure, since the first electrode and the second electrode are disposed on different planes, it is possible to implement various assembly electrode structures capable of improving the assembly rate of the semiconductor light emitting diodes, in particular, to selectively assemble the semiconductor light emitting diodes in a specific cell when the first electrode and the second electrode are disposed to cross each other.

DESCRIPTION OF DRAWINGS

FIG. 1 is a conceptual diagram illustrating an embodiment of a display device using a semiconductor light emitting diode of the present disclosure.

FIG. 2 is a partially enlarged view of portion A of the display device of FIG. 1.

FIG. 3 is an enlarged view of the semiconductor light emitting diode of FIG. 2.

FIG. 4 is an enlarged view illustrating another embodiment of the semiconductor light emitting diode of FIG. 2.

FIGS. 5a to 5e are conceptual views for describing a new process of manufacturing the semiconductor light emitting diode.

FIG. 6 is a conceptual diagram illustrating an example of a self-assembly apparatus of a semiconductor light emitting diode according to the present disclosure.

FIG. 7 is a block diagram of the self-assembly apparatus of FIG. 6.

FIGS. 8a to 8e are conceptual views illustrating a process of self-assembling a semiconductor light emitting diode using the self-assembly apparatus of FIG. 6.

FIG. 9 is a conceptual diagram for describing the semiconductor light emitting diode of FIGS. 8a to 8e.

FIGS. 10a to 10c are conceptual views illustrating a state in which a semiconductor light emitting diode is transferred after a self-assembly process according to the present disclosure.

FIGS. 11 to 13 are flowcharts illustrating a method of manufacturing a display device including semiconductor light emitting diodes that emit red (R) light, green (G) light, and blue (B) light.

FIG. 14 is a view showing the structure of a conventional assembly board.

FIG. 15 is a conceptual diagram illustrating a form of an electric field formed between assembly electrodes.

FIG. 16 is a view showing a state in which an assembly electrode formed on a conventional assembly board is short-circuited.

FIG. 17 is a cross-sectional view of an assembly board according to an embodiment of the present disclosure.

FIG. 18 is a view showing a structure of an assembly electrode formed on an assembly board according to another embodiment of the present disclosure.

FIGS. 19a and 19b are cross-sectional views of the assembly board according to FIG. 18.

FIG. 20 is a view showing a structure of an assembly electrode formed on an assembly board according to another embodiment of the present disclosure.

FIGS. 21a to 21f are views sequentially illustrating a process of manufacturing an assembly board according to an embodiment of the present disclosure.

MODE FOR INVENTION

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or there are intervening elements therebetween.

The display device described herein may include mobile phones, smart phones, laptop computers, digital broadcasting terminals, personal digital assistants (PDA), portable multimedia players (PMP), navigation systems, slate PCs, a Tablet PC, Ultra Books, digital TVs, desktop computers, and the like. However, the configuration according to the embodiments described herein can be applied as long as it can include a display even in a new product form to be developed later.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a control unit of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in a upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 205 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on a substrate of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5a to 5e are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

First, according to the manufacturing method, a first conductivity type semiconductor layer 153, an active layer 154, and a second conductivity type semiconductor layer 155 are individually grown on a growth substrate 159 (FIG. 5a).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5a, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 159 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire (Al2O3) board, or use at least one of Si, GaAs, GaP, InP, and Ga2O3.

Next, at least a portion of the first conductivity type semiconductor layer 153, the active layer 154, and the second conductivity type semiconductor layer 155 are removed to form a plurality of semiconductor light emitting diodes (FIG. 5b).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Next, second conductivity type electrodes 156 (or p-type electrodes) are formed on one surface of the second conductivity type semiconductor layer 155 (FIG. 5c). The second conductive electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Then, the growth substrate 159 is removed to provide a plurality of semiconductor light emitting diodes. For example, the growth substrate 159 may be removed using a laser lift-off (LLO) method or a chemical lift-off (CLO) method (FIG. 5d).

Thereafter, the semiconductor light emitting diodes 150 are seated on a board 261 in a chamber filled with a fluid (FIG. 5e).

For example, the semiconductor light emitting diodes 150 and the board are put in the chamber filled with a fluid, and the semiconductor light emitting diodes are self-assembled onto the board 261 using flow, gravity, surface tension, and the like. In this case, the board may be an assembly board 161.

As another example, it is also possible to put the wiring board in a fluid chamber instead of the assembly board 161 so that the semiconductor light emitting diodes 150 are directly seated on the wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8a to 8e are conceptual views illustrating a process of self-assembling a semiconductor light emitting diode using the self-assembly apparatus of FIG. 6, and FIG. 9 is a conceptual diagram for describing the semiconductor light emitting diode of FIGS. 8a to 8e.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may include a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as $SiO_2$, $SiN_x$, SiON, $Al_2O_3$, $TiO_2$, $HfO_2$, or the like. Alternatively, the dielectric layer 161b may be comprised of a single layer or a multi-layer as an organic insulator. The dielectric layer 161b may have a thickness of several tens of nm to several μm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board 161 due to an electric field while moving by a change in the position of the magnet. Hereinafter, an assembly process using the self-assembly apparatus described above will be described in more detail.

First, a plurality of semiconductor light emitting diodes 1050 including a magnetic material are formed through the process described with reference to FIGS. 5a to 5c. In this case, in the process of forming the second conductivity type electrode of FIG. 5c, a magnetic material may be deposited on the semiconductor light emitting diode.

Next, the board 161 is transferred to an assembly position, and the semiconductor light emitting diodes 1050 are put into the fluid chamber 162 (FIG. 8a).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Next, a magnetic force is applied to the semiconductor light emitting diodes 1050 such that the semiconductor light emitting diodes 1050 vertically float in the fluid chamber 162 (FIG. 8b)

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board 161.

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board 161, clockwise or counterclockwise (FIG. 8c). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8c). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8d). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-screen display device at a low cost.

On the other hand, the present disclosure provides a structure and method for an assembly board for increasing the yield of the above-described self-assembly process and the process yield after self-assembly. The present disclosure is limited to a case where the board 161 is used as an assembly board. That is, the assembly board, which will be described later, is not used as a wiring board of the display device. Accordingly, the board 161 will be referred to as an assembly board 161 hereinafter.

The present disclosure improves the process yield in two respects. First, according to the present disclosure, it is possible to prevent an electric field from occurring strongly at an unwanted position, and the semiconductor light emitting diode from being seated at an unwanted position. Second, according to the present disclosure, it is possible to prevent a semiconductor light emitting diode from remaining on the assembly board when semiconductor light emitting diodes seated on the assembly board are transferred to another substrate.

The above-described objects are not individually achieved by different components. The two objects described above may be achieved by organically combining the components to be described later and the assembly board 161 described above.

Before describing the present disclosure in detail, a post-process for manufacturing a display device after self-assembly will be described.

FIGS. 10a to 10c are conceptual views illustrating a state in which a semiconductor light emitting diode is transferred after a self-assembly process according to the present disclosure.

When the self-assembly process described with reference to FIGS. 8a to 8e is finished, the semiconductor light emitting diodes have been seated at preset positions of the assembly board 161. The semiconductor light emitting diodes seated on the assembly board 161 are transferred to another board at least once. Although the semiconductor light emitting diodes mounted on the assembly board 161 are described as being transferred twice in the present specification, the present disclosure is not limited thereto, and the semiconductor light emitting diodes mounted on the assembly board 161 may be transferred to another board once or three times.

On the other hand, immediately after the self-assembly process is finished, the assembly surface of the assembly board 161 is facing downward (or in the direction of gravity). For processes after the self-assembly process, the assembly board 161 may be turned 180 degrees in a state in which the semiconductor light emitting diode are seated thereon. In this process, since there is a risk that the semiconductor light emitting diode is separated from the assembly board 161, a voltage may be applied to a plurality of electrodes 161c (hereinafter, assembly electrodes) while the assembly board 161 is being turned over. An electric field formed between the assembly electrodes may prevent the semiconductor light emitting diodes from being separated from the assembly board 161 while the assembly board 161 is being turned over.

When the assembly board 161 is turned over 180 degrees after the self-assembly process, the state is as shown in FIG. 10a. Specifically, as shown in FIG. 10a, the assembly surface of the assembly board 161 is facing upward (or in a direction opposite to gravity). In this state, the transfer board 400 is aligned above the assembly board 161.

The transfer board 400 is a board for transferring the semiconductor light emitting diodes seated on the assembly board 161 to a wiring board by detaching the semiconductor light emitting diodes. The transfer board 400 may be formed of a polydimethylsiloxane (PDMS) material. Accordingly, the transfer board 400 may be referred to as a PDMS board.

The transfer board 400 is pressed against the assembly board 161 after being aligned with the assembly board 161. Thereafter, when the transfer board 400 is transferred to the upper side of the assembly board 161, the semiconductor light emitting diodes 350 disposed on the assembly board 161 are transferred to the transfer board 400 due to the adhesion of the transfer board 400.

To this end, the surface energy between the semiconductor light emitting diodes 350 and the transfer board 400 should be higher than the surface energy between the semiconductor light emitting diodes 350 and the dielectric layer 16 lb. Since probability that the semiconductor light emitting diodes 350 are separated from the assembly board 161 increases as the difference between the surface energy between the semiconductor light emitting diodes 350 and the transfer board 400 and the surface energy between the semiconductor light emitting diodes 350 and the dielectric layer 161b increases, it is preferable that the difference between the two surface energies is greater.

On the other hand, when the transfer board 400 is pressed against the assembly board 161, the transfer board 400 may include a plurality of protrusions 410 such that the pressure applied by the transfer board 400 is concentrated on the semiconductor light emitting diodes 350. The protrusions 410 may be formed at the same interval as the semiconductor light emitting diodes seated on the assembly board 161. When the projections 410 are aligned to overlap the semiconductor light emitting diodes 350 and then the transfer board 400 is pressed against the assembly board 161, the pressure exerted by the transfer board 400 may be concentrated to only the semiconductor light emitting diodes 350. Through this, the present disclosure increases the probability that the semiconductor light emitting diodes are separated from the assembly board 161.

Meanwhile, it is preferable that a portion of the semiconductor light emitting diode is exposed to the outside of the groove while the semiconductor light emitting diode is seated on the assembly board 161. When the semiconductor light emitting diode 350 is not exposed to the outside of the groove, the pressure by the transfer board 400 is not concentrated on the semiconductor light emitting diode 350, thus reducing probability that the semiconductor light emitting diode 350 is separated from the assembly board 161.

Finally, referring to FIG. 10c, the semiconductor light emitting diodes 350 are transferred from the transfer board 400 to the wiring board 500 by pressing the transfer board 400 against the wiring board 500. In this case, protrusions 510 may be formed on the wiring board 500. The transfer board 400 and the wiring board 500 are aligned with each other such that the semiconductor light emitting diodes 350 disposed on the transfer board 400 overlap the protrusions 510. Thereafter, when the transfer board 400 and the wiring board 500 are compressed, the probability that the semiconductor light emitting diodes 350 are separated from the transfer board 400 may increase due to the protrusions 510.

Meanwhile, in order for the semiconductor light emitting diodes 350 disposed on the transfer board 400 to be transferred to the wiring board 500, the surface energy between the semiconductor light emitting diodes 350 and the wiring board 500 should be higher than the surface energy between the semiconductor light emitting diodes 350 and the transfer board 400. Since probability that the semiconductor light emitting diodes 350 are separated from the transfer board 400 increases as the difference between the surface energy between the semiconductor light emitting diodes 350 and the wiring board 500 and the surface energy between the semiconductor light emitting diodes 350 and the transfer board 400 increases, it is preferable that the difference between the two surface energies is greater.

After transferring all the semiconductor light emitting diodes 350 disposed on the transfer board 400 to the wiring board 500, electrical connections between the semiconductor light emitting diodes 350 and the wiring electrodes formed on the wiring board may be formed. The structure of the wiring electrode and the method of forming the electrical connection may be changed depending on the type of the semiconductor light emitting diode 350.

Meanwhile, although not shown, an anisotropic conductive film may be disposed on the wiring board 500. In this case, the electrical connections may be formed between the semiconductor light emitting diodes 350 and the wiring electrodes formed on the wiring board 500 only by pressing the transfer board 400 and the wiring board 500.

Meanwhile, in the case of manufacturing a display device including semiconductor light emitting diodes emitting different colors, the method described with reference to FIGS. 10a to 10c may be implemented in various ways. Hereinafter, a method of manufacturing a display device including semiconductor light emitting diodes that emit red (R) light, green (G) light, and blue (B) light will be described.

FIGS. 11 to 13 are flowcharts illustrating a method of manufacturing a display device including semiconductor light emitting diodes that emit red (R) light, green (G) light, and blue (B) light.

The semiconductor light emitting diodes emitting different colors may be individually assembled on different assembly boards. Specifically, the assembly board 161 may include a first assembly board on which semiconductor light emitting diodes emitting a first color are mounted, a second assembly board on which semiconductor light emitting diodes emitting a second color different from the first color are mounted, and a third assembly board on which semiconductor light emitting diodes emitting a third color different from the first and second colors are mounted. Different types of semiconductor light emitting diodes are assembled on the assembly boards according to the method described with reference to FIGS. 8a to 8e. For example, the semiconductor light emitting diodes emitting red (R) light, green (G) light, and blue (B) light may be respectively assembled on the first to third assembly boards.

Referring to FIG. 11, a RED chip, a green chip, and a BLUE chip may be respectively assembled on the first to third assembly boards RED TEMPLATE, GREEN TEMPLATE, and BLUE TEMPLATE. In this state, the RED chip, the GREEN chip, and the BLUE chip may be transferred to the wiring board by different transfer boards respectively.

Specifically, transferring the semiconductor light emitting diodes seated on the assembly board to the wiring board may include transferring the semiconductor light emitting diodes (RED chips) emitting the first color from the first assembly board (RED TEMPLATE) to a first transfer board (stamp (R)) by pressing the first transfer board (stamp (R)) against the first assembly board (RED TEMPLATE); transferring the semiconductor light emitting diodes (GREEN chips) emitting the second color from the second assembly board (GREEN TEMPLATE) to a second transfer board (stamp (G)) by pressing the second transfer board (stamp (G)) against the second assembly board (GREEN TEMPLATE); and transferring the semiconductor light emitting diodes (BLUE chips) emitting the third color from the third assembly board (BLUE TEMPLATE) to a third transfer board (stamp (B)) by pressing the third transfer board (stamp (B)) against the third assembly board (BLUE TEMPLATE).

Thereafter, by individually pressing the first to third transfer boards to the wiring board, the semiconductor light emitting diodes emitting light of the first to third colors are transferred from the first to third transfer boards to the wiring board.

According to the manufacturing method of FIG. 11, three types of assembly boards and three types of transfer boards are required to manufacture a display device including a RED chip, a GREEN chip, and a BLUE chip.

On the other hand, referring to FIG. 12, each of a RED chip, a GREEN chip, and a BLUE chip may be respectively assembled on the first to third assembly boards RED TEMPLATE, GREEN TEMPLATE, and BLUE TEMPLATE. In this state, the RED chip, the GREEN chip, and the BLUE chip may be transferred to the wiring board by the same transfer board respectively.

Specifically, transferring the semiconductor light emitting diodes seated on the assembly board to the wiring board may include transferring the semiconductor light emitting diodes (RED chips) emitting the first color from the first assembly board (RED TEMPLATE) to a transfer board (RGB integrated stamp) by pressing the transfer board (RGB integrated stamp) against the first assembly board (RED TEMPLATE); transferring the semiconductor light emitting diodes (GREEN chips) emitting the second color from the second assembly board (GREEN TEMPLATE) to the transfer board (RGB integrated stamp) by pressing the transfer board (RGB integrated stamp) against the second assembly board (GREEN TEMPLATE); and transferring the semiconductor light emitting diodes (BLUE chips) emitting the third color from the third assembly board (BLUE TEMPLATE) to the transfer board (RGB integrated stamp) by pressing the transfer board (RGB integrated stamp) against the third assembly board (BLUE TEMPLATE).

In this case, alignment positions between the first to third assembly boards and the transfer board may be different from each other. For example, when alignment between the assembly board and the transfer board is completed, a relative position of the transfer board with respect to the first assembly board may be different from a relative position of the transfer board with respect to the second assembly board. The alignment position of the transfer board may be shifted by the PITCH of the SUB PIXEL whenever the type of the assembly board is changed. In this way, when the transfer board is sequentially pressed against the first to third assembly boards, all three types of chips may be transferred to the transfer board.

Thereafter, as in FIG. 11, the semiconductor light emitting diodes emitting light of the first to third colors are transferred from the transfer board to the wiring board by pressing the transfer board against the wiring board.

According to the manufacturing method of FIG. 12, three types of assembly boards and one type of transfer board are required to manufacture a display device including a RED chip, a GREEN chip, and a BLUE chip.

Unlike the above-described FIGS. 11 and 12, according to FIG. 13, the RED chip, the GREEN chip, and the BLUE chip may be assembled on one assembly board (RGB integrated TEMPLATE). In this state, the RED chip, the GREEN chip, and the BLUE chip may be transferred to the wiring board by the same transfer board (RGB integrated stamp).

According to the manufacturing method of FIG. 13, one type of assembly board and one type of transfer board are required to manufacture a display device including a RED chip, a GREEN chip, and a BLUE chip.

As described above, when manufacturing a display device including semiconductor light emitting diodes that emit light of different colors, a manufacturing method thereof may be implemented in various ways.

In the self-assembly method described above, the present disclosure relates to an assembly board having a structure capable of improving the self-assembly rate of a light emitting diode by arranging the assembly electrodes receiving voltage signals of different polarities from among the assembly electrodes formed on the assembly board to form an electric field on different planes to prevent a short circuit between the electrodes. Various embodiments of the present disclosure will be described below with reference to the accompanying drawings.

First, the conventional assembly board structure and the shape of the electric field formed on the assembly board during self-assembly will be briefly described with reference to FIGS. 14 to 16.

FIG. 14 is a view showing the structure of a conventional assembly board, FIG. 15 is a conceptual diagram illustrating a form of an electric field formed between assembly electrodes, and FIG. 16 is a view showing a state in which an assembly electrode formed on a conventional assembly board is short-circuited.

The assembly board 161 is a board used in a method of manufacturing a display device, and specifically, may be a board used in a method of manufacturing a display device through self-assembly. Here, the self-assembly may be a display manufacturing method in which the semiconductor light emitting diodes 150 are seated at preset positions of the assembly board 161 using an electric field and a magnetic field. In addition, the semiconductor light emitting diode 150 to be described below may refer to a semiconductor light emitting diode including a magnetic material to be self-assembled on the assembly board 161 by an electric field and a magnetic field.

As shown in FIG. 14, the conventional assembly board 161 may include a base portion 161a, a dielectric layer 161b, a plurality of assembly electrodes 161c, cells 161d on which the semiconductor light emitting diodes 150 are mounted, and barrier ribs 161e.

The assembly electrodes 161c may extend in one direction and may be disposed in parallel on the base portion 161a, and the dielectric layer 161b may be disposed on the base portion 161a to cover the plurality of assembly electrodes 161c.

The barrier ribs 161e may be stacked on the dielectric layer 161b. The barrier ribs 161e may be stacked to form the cells 161d on which the semiconductor light emitting diode 150 are seated at predetermined intervals along the extending direction of the assembly electrode 161c so as to overlap a portion of the assembly electrode 161c.

On the other hand, as a voltage is applied from the outside to the assembly electrode 161c, an electric field E1 may be formed in the cell 161d as shown in FIG. 15, and the semiconductor light emitting diode 150 is seated on the cell 161d by the electric field E1. Voltage signals of different polarities may be applied to the adjacent assembly electrodes 161c to form the electric field E1, thereby forming the electric field El in a region between the adjacent assembly electrodes 161c. The electric field El is stronger as it closer to the assembly electrodes 161c, and is weaker as it is farther from the assembly electrodes 161c.

The assembly board 161 may include a voltage applying unit 170 that supplies a voltage to the assembly electrodes 161c as external power being applied to the assembly surface on which the assembly electrodes 161c are formed.

The voltage applying unit 170 may include an electrode pad connected to a power supply unit (not shown) to receive power, and a bus line connected to the electrode pad and the assembly electrodes 161c to supply voltage to the assembly electrodes 161c.

The voltage applying unit 170 may be provided on both sides with respect to the extending direction of the assembly electrodes 161c. In this case, the voltage applying unit 170a (hereinafter, referred to as a first voltage applying unit) provided on one side may apply a voltage of a positive (+) signal to the assembly electrodes 161c, and the voltage applying unit 170b (hereinafter, a second voltage applying unit) provided on the other side is provided on the other side may apply a voltage of a negative (−) signal to the assembly electrodes 161c.

The first voltage applying unit 170a and the second voltage applying unit 170b may be selectively connected to different assembly electrodes 161c. That is, one assembly electrode 161c may be connected to one of the first voltage applying unit 170a and the second voltage applying unit 170b to apply a voltage signal having a positive (+) or negative (−) polarity.

In addition, the assembly electrodes 161c adjacent to the assembly surface to form the electric field E1 may be connected to different voltage applying units 170 to apply voltage signals of different polarities.

Meanwhile, the semiconductor light emitting diode 150 may be assembled on the assembly board 200 using the above-described self-assembly apparatus. In this case, the assembly surface may be disposed to face the fluid in which the semiconductor light emitting diode 150 is floating, and the electric field E1 may be formed on the assembly surface to guide the semiconductor light emitting diode 150 toward the assembly surface. In such an assembly environment, micro-sized particles (P) may adhere to the assembly surface, and there is a problem in that a short circuit occurs between adjacent assembly electrodes 161c due to the particles (P). On the other hand, when an electrode short circuit occurs, the electric field E1 is not formed on the entire assembly surface, causing a problem in that the assembly rate of the semiconductor light emitting diode 150 is greatly reduced.

Hereinafter, an assembly board having a structure in which assembly electrodes to which voltage signals of different polarities are applied are disposed on different planes and a method of manufacturing the assembly board according to an embodiment of the present disclosure will be described with reference to FIGS. 17 to 21.

FIG. 17 is a cross-sectional view of an assembly board according to an embodiment of the present disclosure, FIG. 18 is a view showing a structure of an assembly electrode formed on an assembly board according to another embodiment of the present disclosure, FIGS. 19a and 19b are cross-sectional views of the assembly board according to FIG. 18, FIG. 20 is a view showing a structure of an assembly electrode formed on an assembly board according to another embodiment of the present disclosure, and FIGS. 21a to 21f are views sequentially illustrating a process of manufacturing an assembly board according to an embodiment of the present disclosure.

The assembly board 200 according to the embodiment of the present disclosure may be a board used for self-assembly of the semiconductor light emitting diodes 150, like the assembly board 161 described above, and may include a base portion 210, a dielectric layer 220, a plurality of assembly electrodes 230, cells 240 on which the semiconductor light emitting diodes 150 is mounted, and barrier ribs 250.

The plurality of assembly electrodes 230 may extend in one direction and may be disposed on the base portion 210 at predetermined intervals.

The dielectric layer 220 may be stacked on the base portion 210 to cover the plurality of assembly electrodes 230. The barrier ribs 250 may be stacked on the dielectric layer 220, and the barrier ribs 250 may be stacked on the dielectric layer 220 while forming the cells 240 on which the semiconductor light emitting diode 150 are seated at predetermined intervals along the extending direction of the assembling electrodes 230 to overlap a portion of the assembly electrode 230.

As a voltage is applied to the assembly electrodes 230, the electric field E1 may be formed inside the cell 240 formed to overlap a portion of the assembly electrode 230, and the semiconductor light emitting diode 150 may be seated in the cell 240 due to the electric field E1.

According to an embodiment of the present disclosure, the assembly electrodes 230 may be disposed on different planes on the base portion 210. For example, according to the present embodiment, the assembly electrodes 230 may be divided into a first electrode 230a and a second electrode 230b according to on which plane the assembly electrodes 230 are disposed, and the first electrode 230a may be disposed on one surface of the base portion and the second electrode 230b may be disposed on one surface of the dielectric layer 220 (see (b) of FIG. 17). That is, the assembly board 200 may have a structure in which the first electrode 230a and the second electrode 230b are separated from each other by the dielectric layer 220. In addition, voltage signals having different polarities may be applied to the first electrode 230a and the second electrode 230b separated from each other.

According to an embodiment of the present disclosure, the dielectric layer 220 may be formed of two layers in order to arrange the assembly electrodes 230 on different planes. Specifically, the dielectric layer 220 may include a first dielectric layer 220a which is formed to cover the first electrodes 230a disposed on one surface of the base 210 and on which the second electrodes 230b are disposed and a second dielectric layer 220b which is formed to cover the second electrodes 230b and the first dielectric layer 220a, and on which the barrier ribs 250 are stacked.

The dielectric layer 220 may be divided into the first dielectric layer 220a and the second dielectric layer 220b to separate the first electrode 230a and the second electrode 230b, and the first dielectric layer 220a and the second dielectric layer 220b may have the same function (e.g., an insulating function).

Hereinafter, various embodiments of the first electrodes 230a and the second electrodes 230b constituting the assembly electrode 230 will be described.

First, at least one of the first electrodes 230a and the second electrodes 230b may be disposed in parallel between adjacent electrodes disposed on the same plane. The first electrodes 230a disposed on the base portion 210 may be parallel to each other between the first electrodes 230a, and the second electrodes 230b disposed on the first dielectric layer 220a may be parallel to each other between the second electrodes 230b.

In this case, as an embodiment, the first electrodes 230a and the second electrodes 230b may be disposed in parallel to each other (see (a) of (FIG. 17). That is, the first electrodes 230a and the second electrodes 230b disposed on different planes may be disposed in parallel to each other. In addition, when the first electrodes 230a and the second electrodes 230b are parallel to each other as described above, the first electrodes 230a and the second electrodes 230b may be alternately disposed, and the cells 240 may overlap a portion of the first electrode 230a and a portion of the second electrode 230b.

In another embodiment, the first electrodes 230a and the second electrodes 230b may be disposed to cross each other. Hereinafter, a portion of the second electrode 230b formed to cross the first electrode 230a is referred to as a crossing line 232b.

The second electrodes 230b may include crossing lines 232b disposed to cross the first electrode 230a, and the crossing lines 232b may be parallel to each other.

The first electrodes 230a and the second electrodes 230b may cross each other at various angles, and preferably, the first electrodes 230a and the second electrodes 230b may be orthogonal to each other. When the first electrodes 230a and the second electrodes 230b are orthogonal to each other, the semiconductor light emitting diodes may be assembled at more positions, which is advantageous in terms of utilization of the assembly board.

When the first electrodes 230a and the second electrodes 230b cross each other, the cell 240 on which the semiconductor light emitting diode 150 may be formed to overlap a portion of the first electrode 230a and a portion of the second electrode 230b in the vicinity of a point at which the first electrode 230a crosses the second electrode 230b.

When the first electrodes 230a and the second electrodes 230b are disposed to cross each other, there is an advantage in that the semiconductor light emitting diode 150 is selectively assembled in a specific cell 240. Specifically, in FIG. 18, when a voltage is applied to one first electrode 230a and one second electrode 230b, the electric field E1 is formed only in the cell 240 formed in the vicinity of the point at which the first electrode 230a and the second electrode 230b to which the voltage is applied cross each other, thus enabling selective assembly of the semiconductor light emitting diode 150.

In particular, the assembly board 200 comprised of at least two partial pixels among R, G, and B partial pixels may be manufactured, and the partial pixels may be assembled in a desired arrangement.

In addition, in a repair process after self-assembly, the semiconductor light emitting diode 150 may be selectively assembled in a specific site on which the semiconductor light emitting diode 150 is not assembled.

In another embodiment, when the first electrodes 230a and the second electrodes 230b cross each other, any one of the first electrodes 230a and the second electrodes 230b may further include a plurality of protrusions 231b protruding in a direction parallel to the second electrodes 230b or the first electrodes 230a (see FIGS. 18 and 20).

The protrusion 23 lb may be provided to correspond to each cell 240, and may reinforce the strength of the electric field E1 formed between the first electrode 230a and the second electrode 230b. For example, when the second electrode 230b includes the protrusion 231b, the first electrode 230a and the protrusion 232b of the second electrode 230b parallel to the first electrode 230a may be alternately disposed, and the cell 240 may overlap a portion of the first electrode 230a and a portion of the second electrode 230b. In this case, the cell 240 may overlap a portion of the first electrode 230a and a portion of the protrusion 232b.

Although it has been described in the above description and the accompanying drawings that the second electrodes 230b include the protrusions 231b, the first electrodes 230a may have the structure of the second electrodes 230b.

Next, a process of manufacturing the assembly board 200 including the assembly electrodes 230 disposed on different planes described above will be described with reference to FIGS. 21a to 21f.

First, a metal for forming the first electrode 230a is deposited on the base portion 210 (FIG. 21a). The base portion 210 may be made of an insulating material, and Mo/Al/Mo, Ti/Cu/To, ITO, or the like may be deposited on the base portion 210 as a metal for forming the first electrode 230a. The metal may be deposited on the base portion 210 to a thickness of several tens to several hundred of nm.

A pattern is formed in the deposited metal through a photoresist process, and then etched at predetermined intervals to form a plurality of first electrodes 230a (FIG. 21b). The first electrodes 230a may be disposed on the base portion 210 at predetermined intervals by etching.

Next, a first dielectric layer 220a may be stacked on the base portion 210 to cover the first electrodes 230a, and stacked along the peripheries of the base portion 210 and the first electrodes 230a (FIG. 2c). The first dielectric layer 220a may be formed of an insulating material such as an inorganic material such as insulating SiO2, SiNx, or Al2O3, or an organic polymer. In addition, when the thickness of the first dielectric layer 220a is too thin, the electrode is easily damaged by corrosion, and when the thickness of the first dielectric layer 220a is too thick, the influence of the electric field E1 may be weakened to reduce the assembly force, so that the thickness of the first dielectric layer 220a may be deposited to a thickness of several tens to hundreds of nm.

The second electrode 230b may be formed on the first dielectric layer 220a in the same manner as the first electrode 230a (FIG. 21d). That is, the second electrode 230b may be formed by depositing a metal for forming the second electrode 230b on the first dielectric layer 220a, forming a pattern through a photoresist process, and then performing etching.

In one embodiment, the second electrode 230b may be formed in a region of the first dielectric layer 220a that does not overlap the first electrode 230a. In this case, the first electrode 230a and the second electrode 230a may be arranged to be parallel to each other. Voltages of different polarities are applied to the adjacent first electrode 230a and second electrode 230b to form a pair of electrodes.

Preferably, the interval between the adjacent first electrode 230a and second electrode 230b may be 25 to 75% of the size of the semiconductor light emitting diode 150. When the interval between the pair of electrodes is too narrow, the probability that the semiconductor light emitting diode 150 is vertically assembled increases, and when the interval is too wide, the assembly force may decrease. The first electrode 230a and the second electrode 230b may be formed to have an interval within the above range.

In another embodiment, the second electrode 230b may be formed on the first dielectric layer 220a to cross the first electrode 230a. The first electrode 230a and the second electrode 230b may cross each other to form an intersection angle of about 5° to 90°, and preferably may be orthogonal to each other.

Next, a second dielectric layer 220b may be stacked on the first dielectric layer 220a to cover the second electrodes 230b, and stacked along the peripheries of the first dielectric layer 220a and the second electrodes 230b (FIG. 2f). The second dielectric layer 220b may be formed of an insulating material such as an inorganic material such as insulating SiO2, SiNx, or Al2O3, or an organic polymer, and may be formed of the same material as or a different material from the first dielectric layer 220a. The second dielectric layer 220b may be deposited with the same or similar thickness as the first dielectric layer 220a (thickness of several tens to hundreds of nm).

Finally, the barrier ribs 250 may be stacked on the second dielectric layer 220b. The barrier ribs 250 may form cells 240 on which the semiconductor light emitting diodes 150 are mounted, and be stacked on the second dielectric layer 220b to overlap a portion of the assembly electrodes 230, that is, a portion of the first electrode 230a and a portion of the second electrode 230b.

The barrier ribs 250 may be formed of a photosensitive polymer (e.g., photosensitive acrylate) or an inorganic material such as SiO2 or SiNx, and may be stacked to a thickness similar to that of the assembled semiconductor light emitting diode 150 (in the height direction), for example, a thickness of several to several tens of μm. When the thickness of the barrier ribs 250 is too thin, it is difficult to distinguish the barrier ribs 250 from the cells 240 during self-assembly, and when the thickness of the barrier ribs 250 is too thick, two or more semiconductor light emitting diodes may be assembled. Therefore, the partition ribs 250 is preferably stacked to a thickness that satisfies the above range.

In addition, the cell 240 formed by the barrier ribs 250 may be formed to have a size larger than that of the semiconductor light emitting diode 150, and may be formed to have a size in which one semiconductor light emitting diode 150 is able to be seated. Preferably, the width of the cell 240 may be formed to be about 20% or more of the size of the semiconductor light emitting diode 150 in consideration of the assembly rate of the semiconductor light emitting diode 150.

In addition, according to the embodiment of the present disclosure, the first dielectric layer 220a and the second dielectric layer 220b are not stacked to be flat, but are stacked along the periphery of the assembly electrode 230, so that the cell 240 may include a recessed portion 260 inside the cell 240. The recessed portion 260 may reduce the contact area between the semiconductor light emitting diode 150 seated in the cell 240 and the dielectric layer 220, thus improving the transfer rate of the semiconductor light emitting diodes 150 in the process of transferring the semiconductor light emitting diodes 150 from the assembly board 200 to the transfer board or a final board.

Hereinafter, a display manufacturing method using the above-described assembly board 200 according to an embodiment of the present disclosure will be briefly described.

According to the present disclosure, the display device may be manufactured using the assembly board 200 having the above-described structure in the same manner as the conventional method of manufacturing the display device through self-assembly.

Specifically, the method of manufacturing a display device according to the present disclosure may include transferring the assembly board 200 having the above-described structure to an assembly position, and putting a plurality of semiconductor light emitting diodes 150 including a magnetic material into a fluid chamber; applying a magnetic force to the semiconductor light emitting diodes 150 put into the fluid chamber such that the semiconductor light emitting diodes 150 move in one direction, inducing the semiconductor light emitting diodes 150 to move to a preset position by applying an electric field such that the semiconductor light emitting elements 150 are seated at preset positions on the assembly board 200 while the semiconductor light emitting elements 150 are moving; and transferring the semiconductor light emitting diodes 150 seated on the assembly board 200 to the final board on which wirings are formed.

The assembly board 200 used in the manufacturing method of the present disclosure is disposed on different planes of the assembly surface, and may include assembly electrodes 230 that form an electric field E1 when a voltage is applied. For example, the assembly electrodes 230 may include a first electrode 230a formed on the base portion 120 and a second electrode 230b formed on the dielectric layer 220, and voltage signals having different polarities may be applied to the first electrode 230a and the second electrode 230b. By disposing the first electrode 230a and the second electrode 230b to be separated from each other as described above to prevent a short circuit between the electrodes.

Meanwhile, the first electrode 230a and the second electrode 230b may be parallel to each other or may cross each other. When the first electrode 230a and the second electrode 230b are parallel to each other, the first electrode 230a and the second electrode 230b may be alternately disposed.

In addition, when the first electrode 230a and the second electrode 230b are parallel to each other, an electric field E1 may be formed in a region between the first electrode 230a and the second electrode 230b, and when the electrode 230a and the second electrode 230b cross each other, an electric field E1 may be formed near a point where the two electrodes cross each other.

The preset position at which the semiconductor light emitting diode 150 is seated may overlap a portion of the first electrode 230a and the second electrode 230b, and in this case, may also overlap a region where the electric field E1 is formed.

Meanwhile, the transferring of the semiconductor light emitting diodes 150 seated on the assembly board 200 to the final board on which wirings are formed may include two or more transfer processes. The semiconductor light emitting diodes 150 seated on the assembly board 200 may be transferred to a transfer board (or a transfer stamp) before being transferred to the final board and then transferred to the final board, and the process may be repeated multiple times.

The present disclosure described above is not limited to the configuration and method of the above-described embodiments, but the embodiments may be configured by selectively combining all or part of embodiments so that various modifications can be made.

The invention claimed is:

1. An assembly board for use in a display manufacturing method for allowing semiconductor light emitting diodes to be seated at preset positions on the assembly board using an electric field and a magnetic field, the assembly board comprising:

a base portion;

a plurality of assembly electrodes extending in one direction and disposed on the base portion at predetermined intervals;

a dielectric layer stacked on the base portion to cover the plurality of assembly electrodes; and barrier ribs stacked on the dielectric layer and defining cells in which the semiconductor light emitting diodes are seated at the predetermined intervals along an extending direction of the plurality of assembly electrodes so as to overlap a portion of the plurality of assembly electrodes, wherein the plurality of assembly electrodes include first electrodes and second electrodes disposed on different planes on the base portion, and wherein the first electrodes are disposed on one surface of the base portion, and the second electrodes are disposed on one surface of the dielectric layer.

2. The assembly board of claim 1, wherein the dielectric layer includes:

a first dielectric layer formed to cover the first electrodes, the second electrodes being disposed on the first dielectric layer; and a second dielectric layer formed to cover the second electrodes and the first dielectric layer, the barrier ribs being stacked on the second dielectric layer.

3. The assembly board of claim 2, further comprising a recess portion located where the first dielectric layer and the second dielectric layer overlap at the cells.

4. The assembly board of claim 1, wherein at least one of the first electrodes and the second electrodes is disposed in parallel to the at least one of the first electrodes and the second electrodes that are adjacent thereto and disposed on the same plane.

5. The assembly board of claim 4, wherein the first electrodes and the second electrodes are parallel to each other.

6. The assembly board of claim 5, wherein the first electrodes and the second electrodes have portions in parallel to each other, which are alternately arranged.

7. The assembly board of claim 4, wherein the first electrodes and the second electrodes cross each other.

8. The assembly board of claim 7, wherein the first electrodes and the second electrodes are orthogonal to each other.

9. The assembly board of claim 7, wherein one of the first electrodes and the second electrodes further includes a plurality of protrusions protruding in a direction parallel to the second electrodes or the first electrodes.

10. The assembly board of claim 9, wherein the plurality of protrusions are provided to correspond to the cells, respectively.

11. The assembly board of claim 9, wherein the first electrodes and the second electrodes have portions in parallel to each other, which are alternately arranged.

* * * * *